(12) United States Patent
Nagashima et al.

(10) Patent No.: US 6,826,081 B2
(45) Date of Patent: Nov. 30, 2004

(54) NONVOLATILE SEMICONDUCTOR MEMORY DEVICE, NONVOLATILE SEMICONDUCTOR MEMORY DEVICE-INTEGRATED SYSTEM, AND DEFECTIVE BLOCK DETECTING METHOD

(75) Inventors: Hirokazu Nagashima, Kawasaki (JP); Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/638,418

(22) Filed: Aug. 12, 2003

(65) Prior Publication Data

US 2004/0042280 A1 Mar. 4, 2004

(30) Foreign Application Priority Data

Aug. 29, 2002 (JP) .......................................... 2002-251788

(51) Int. Cl.$^7$ ............................................... G11C 16/06
(52) U.S. Cl. .............................. 365/185.09; 365/185.11; 365/185.17
(58) Field of Search ........................ 365/185.09, 185.11, 365/185.17

(56) References Cited

U.S. PATENT DOCUMENTS 6,549,464 B2 * 4/2003 Tanaka et al. .......... 365/185.17
6,763,480 B2 * 7/2004 Harari et al. ........... 365/185.09

* cited by examiner

Primary Examiner—Huan Hoang
(74) Attorney, Agent, or Firm—Arent Fox PLLC

(57) ABSTRACT

In a block which is a target of detection of flag data, a page buffer 100 reads data of memory cells 42 of each memory cell by block unit, and latches the data. A detection circuit 28 performs detection of the flag data for each block based on output of the page buffers 100 of one block.

23 Claims, 18 Drawing Sheets

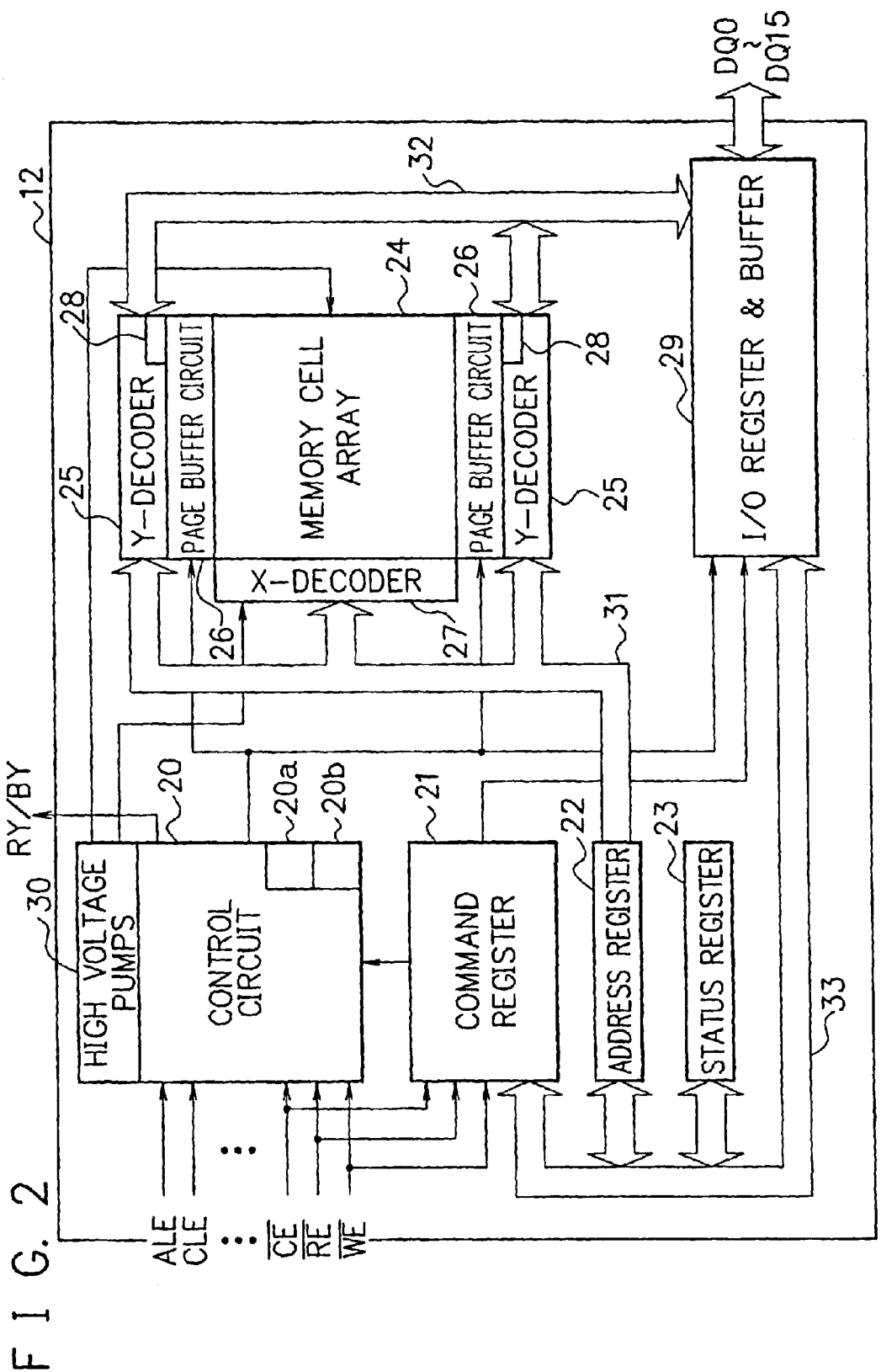
F I G. 2

F I G. 6
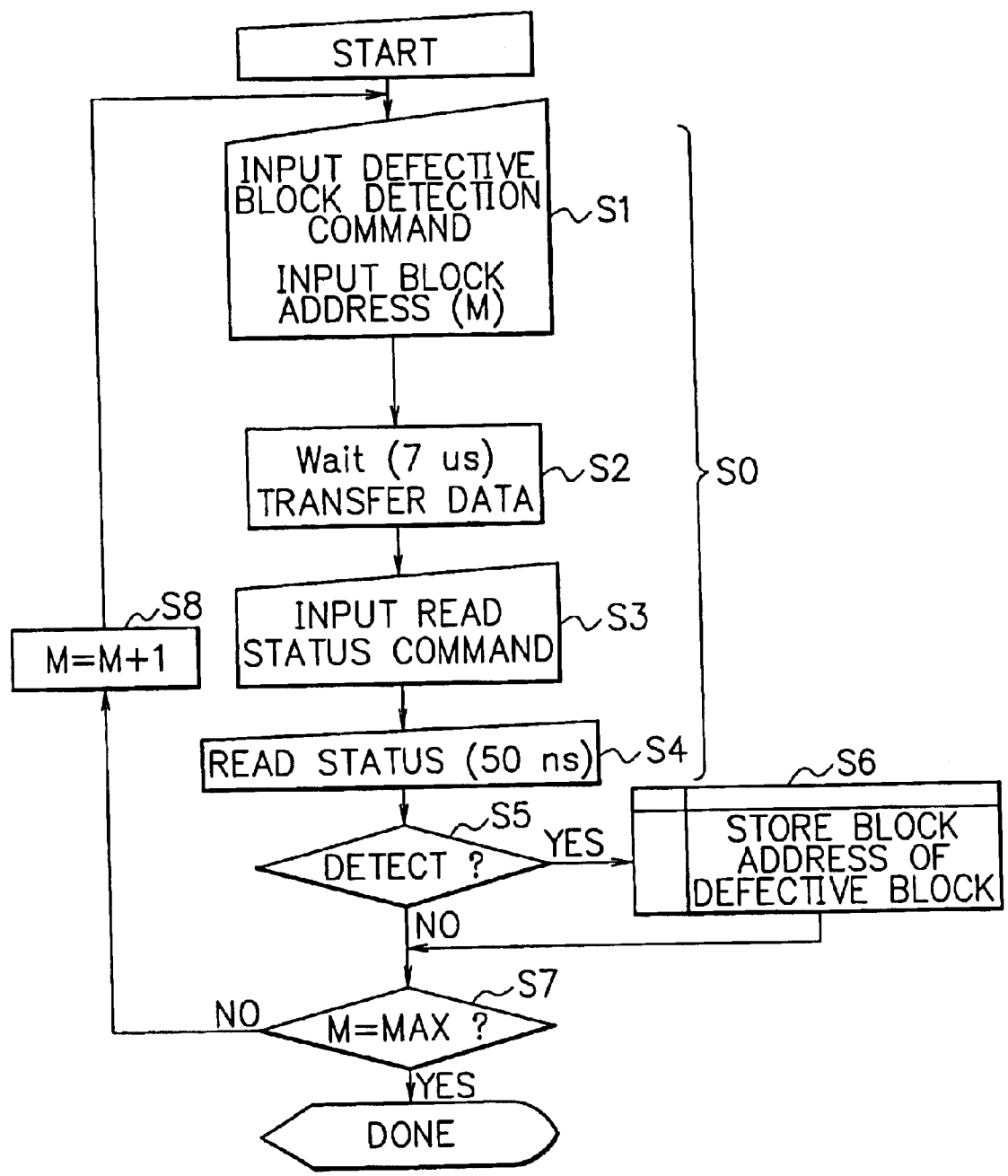

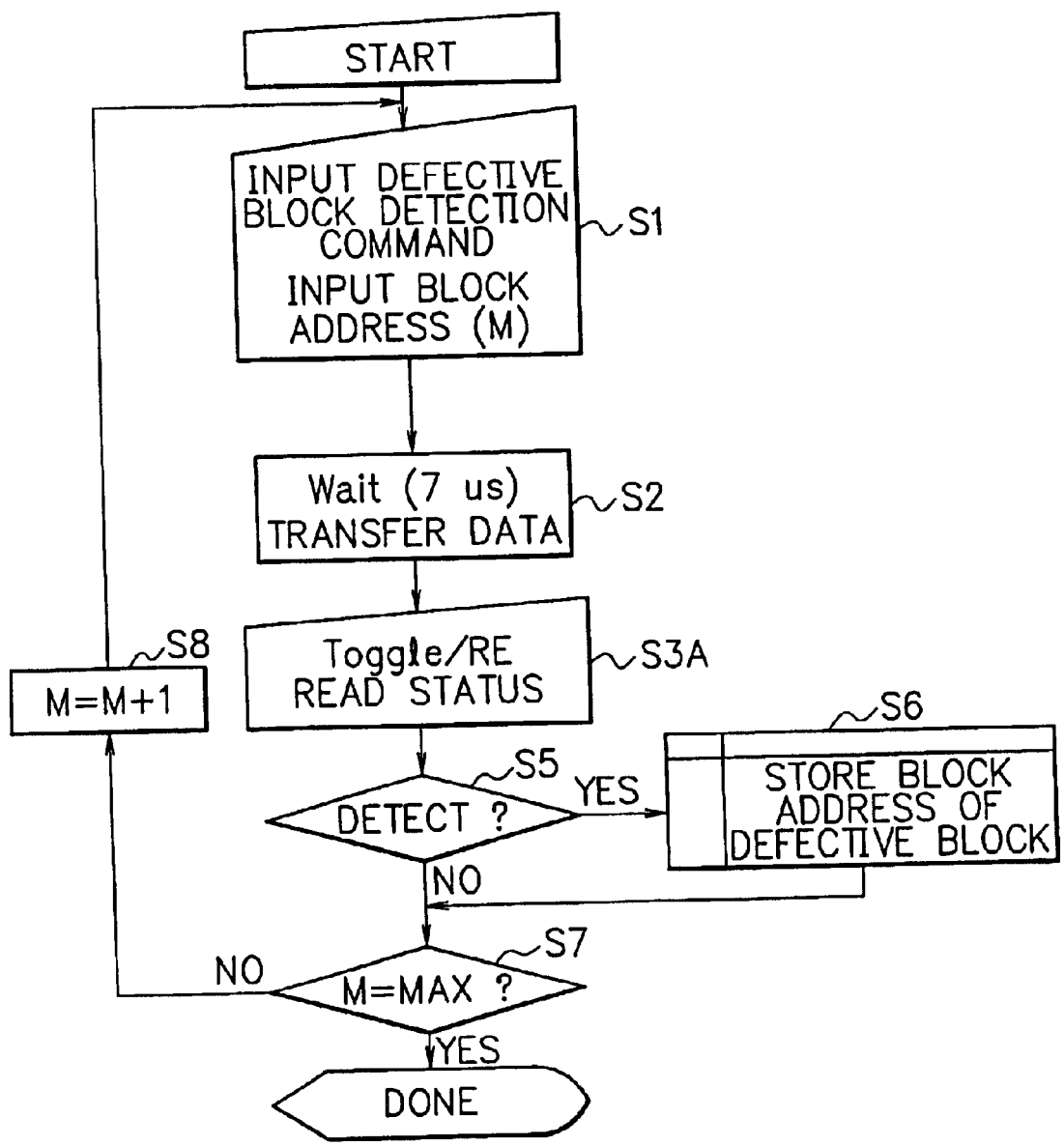
F I G. 12

F I G. 17

|  | PRIOR ART (ENTIRE PAGE SEARCH CHECK) | PRESENT INVENTION (DEFECTIVE BLOCK DETECTION MODE) |
|---|---|---|
| DATA TRANSFER TIME | 115ms (7us×16×1024) | 3.6ms (7us×512) |
| DATA READ TIME | 433ms ((50ns×528×16 ×1024) | 25.6us (50ns×512) |
| TOTAL TIME | ~550ms | ~3.6ms |
| REDUCTION RATE (PRIOR ART 100%) | 100% | ~0.7% |

NONVOLATILE SEMICONDUCTOR MEMORY DEVICE, NONVOLATILE SEMICONDUCTOR MEMORY DEVICE-INTEGRATED SYSTEM, AND DEFECTIVE BLOCK DETECTING METHOD

CROSS-REFERENCE TO RELATED APPLICATIONS

This application is based upon and claims the benefit of priority from the prior Japanese Patent Application No. 2002-251788, filed on Aug. 29, 2002, the entire contents of which are incorporated herein by reference.

BACKGROUND OF THE INVENTION

1. Field of the Invention

The present invention relates to a nonvolatile semiconductor memory device including a memory cell array in which memory cell strings each constituted of a plurality of memory cells connected in series are aligned in an array form, a nonvolatile semiconductor memory device-integrated system, and a defective block detecting method.

2. Description of the Related Art

Recently, the capacity of nonvolatile semiconductor memory devices is acceleratingly increased. As the one representing a nonvolatile semiconductor memory device, there is a NAND cell type EEPROM (hereinafter, referred to as a flash memory) capable of electrically rewriting data and suitable for high-density design. Each memory cell of the flash memory has a structure in which a floating gate (charge storage layer) and a control gate are formed above a semiconductor substrate via an insulating film. A plurality of memory cells are connected in series so as to share a source and drain to constitute a memory cell string, which is connected to a bit line as a unit. Such memory cell strings are aligned in an array form to constitute a memory cell array.

The drain being one end of the memory cell string is connected to the bit line via a first select gate, and the source being the other end is connected to a common source line via a second select gate. The control gate of each memory cell is continuously connected to each other in a row direction by a word line. Usually, a collective unit of the memory cells connected to the same word line is called a page, a collective unit of the pages sandwiched between a set of the first select gate and second select gate is called a block or a sector (hereinafter, referred to as the block). A collective unit of the blocks connected to the same bit line is called a bank. Switching of the banks is usually performed at the most significant bit of a block address (in the case with the two banks).

In a storage region of the flash memory, the collectively erasable minimum unit is one block. These blocks are given addresses. A page buffer connected to the first select gate via the bit line reads one page of data from the memory cells connected to the same word line WL (it can be also said that the data is transferred to the page buffer from the memory cell), and latches it.

The flash memory is usually guaranteed for all the blocks at the shipment. However, depending on the use, all the blocks do not necessarily need to be non-defectives. This is the same as the cases of hard discs and flexible discs. For this reason, devices such as a NAND type flash memory, for which defective in the blocks of a certain percentage (hereinafter, referred to as defective blocks) is admitted from the beginning to reduce production cost of the flash memory and provide them at a reasonable price, are coming along. The tendency is especially growing more and more as a result of the recent increase in the capacity.

In the case of a flash memory-integrated system (nonvolatile semiconductor memory device-integrated system), which is the system integrated with these devices, an address table that is the address list of the defective blocks is created in the flash memory-integrated system. According to this, the flash memory-integrated system performs a control not to access the defective blocks based on the address table. As for a method of creating the address table, the address table is created by storing flag data in a region of the flash memory where the defective blocks exist by a manufacturer at the shipment, and by detecting and determining it in the flash memory integrated-system.

Here, a method of detecting a defective block of a conventional flash memory-integrated system will be explained with use of the drawing.

FIG. 18 is a flow chart showing a process of detecting a defective block of the conventional flash memory integrated-system. The conventional detecting method includes the steps of inputting an address (step S101), determining a page according to the inputted address (step S102), and transferring data to a page buffer from one page of memory cells (step S103), as shown in FIG. 18.

Next, it is determined whether all bits (that means all output bus of 16 bits) of data read out in sequence by one column from the page buffer are "1" (steps S104 to S106). When all the bits of the read data are "1" (Yes in step S106), it is determined whether a number M of the columns is the maximum value. If it is the maximum value, the control is transferred to the next step, and if it is not the maximum value, the number of the columns is incremented (step S109), and the control is returned to step S104. When all the bits of the read data are not "1" (No in step S106), the inputted address is stored as a block address of the defective block (step S107). When the number M of the columns becomes the maximum value (Yes in step S108), it is determined whether a number N of the pages is the maximum value. If the number N of the pages is the maximum value, the detection process is finished. If the number N of the pages is not the maximum value, the number N of the pages is incremented and the control is returned to step S102.

As explained above, in the conventional detection method, it is necessary to read the data of all the memory cells to an outside and create the address table while confirming presence and absence of the flag data, and the detecting time is increased following the increase in the number of memory cells. For example, in the case of an existing 64M bit NAND type flash memory, the number of pages is 16×1024, and the number of data per page is 528 Bytes. The time taken to transfer the data to the page buffer from the memory cell (the aforementioned step S103) is 7 us per page, a serial access cycle is 20 MHz (50 ns/Byte), and therefore the minimum time required for creating the address table in the flash memory-integrated system is $(7+0.05\times528)\times16\times1024=547225.6$ us≈550 ms.

There exists the request for reducing the time required for creating the address table described above. Namely, there arises the request for reducing the time taken to detect defective blocks. It is expected that the aforementioned request will increase still further following the increase in capacity in the future.

SUMMARY OF THE INVENTION

The present invention is made in consideration of the aforementioned circumstances, and has its object to provide a nonvolatile semiconductor memory device, a nonvolatile semiconductor memory device-integrated system, and a defective block detecting method, which are capable of reducing the time required for creating an address table of defective blocks and for detecting the defective blocks.

The present invention is made to solve the aforementioned problem, and is characterized in that in the nonvolatile semiconductor memory device, a nonvolatile semiconductor memory device-integrated system and a defective block detecting method according to the present invention, a block to be a target of detection of flag data is determined, logical product outputting circuit outputs logical product of the data stored in memory cells of each memory cell strings in the determined block, and detection of the flag data is performed for each block based on the output of the logical product outputting circuit, for the nonvolatile semiconductor memory device storing the flag data indicating the defective block in part of the memory cells of the defective block.

As a result, in the nonvolatile semiconductor memory device, the nonvolatile semiconductor memory device-integrated system and the defective block detecting method according to the present invention, the data of all the memory cells in one block is read by onetime processing according to the logical product of each of the memory cell strings, and collective detection of the flag data is performed based on the output of the logical product of each of all the memory cell strings, thus making it possible to detect whether all the memory cells in the selected block have the same data (all bits "1") or not. Namely, it is possible to detect whether different data ("0"=flag data indicating a defective block) exists in the selected block or not at a high speed.

BRIEF DESCRIPTION OF THE DRAWINGS

FIG. 2 is a block diagram showing a schematic constitution of a flash memory 12 shown in FIG. 1;

FIG. 6 is a flow chart showing an operation of a flash memory integrated system 10 detecting a defective block of the flash memory 12 in one embodiment of the present invention;

FIG. 12 is a flow chart showing an example 3 different from the operation flow of the flash memory-integrated system 10 for detecting the defective block of the flash memory 12 shown in FIG. 6;

FIG. 17 is a diagram showing a comparison table of detecting time required for detection of the defective block in the flash memory between a prior art and the present embodiment.

DETAILED DESCRIPTION OF THE PREFERRED EMBODIMENTS

An embodiment of the invention will be explained below.

A schematic constitution of a flash memory-integrated system (nonvolatile semiconductor memory device-integrated system) including a flash memory (nonvolatile semiconductor memory device) as one embodiment of the present invention will be explained with use of the drawings.

Figure 1:
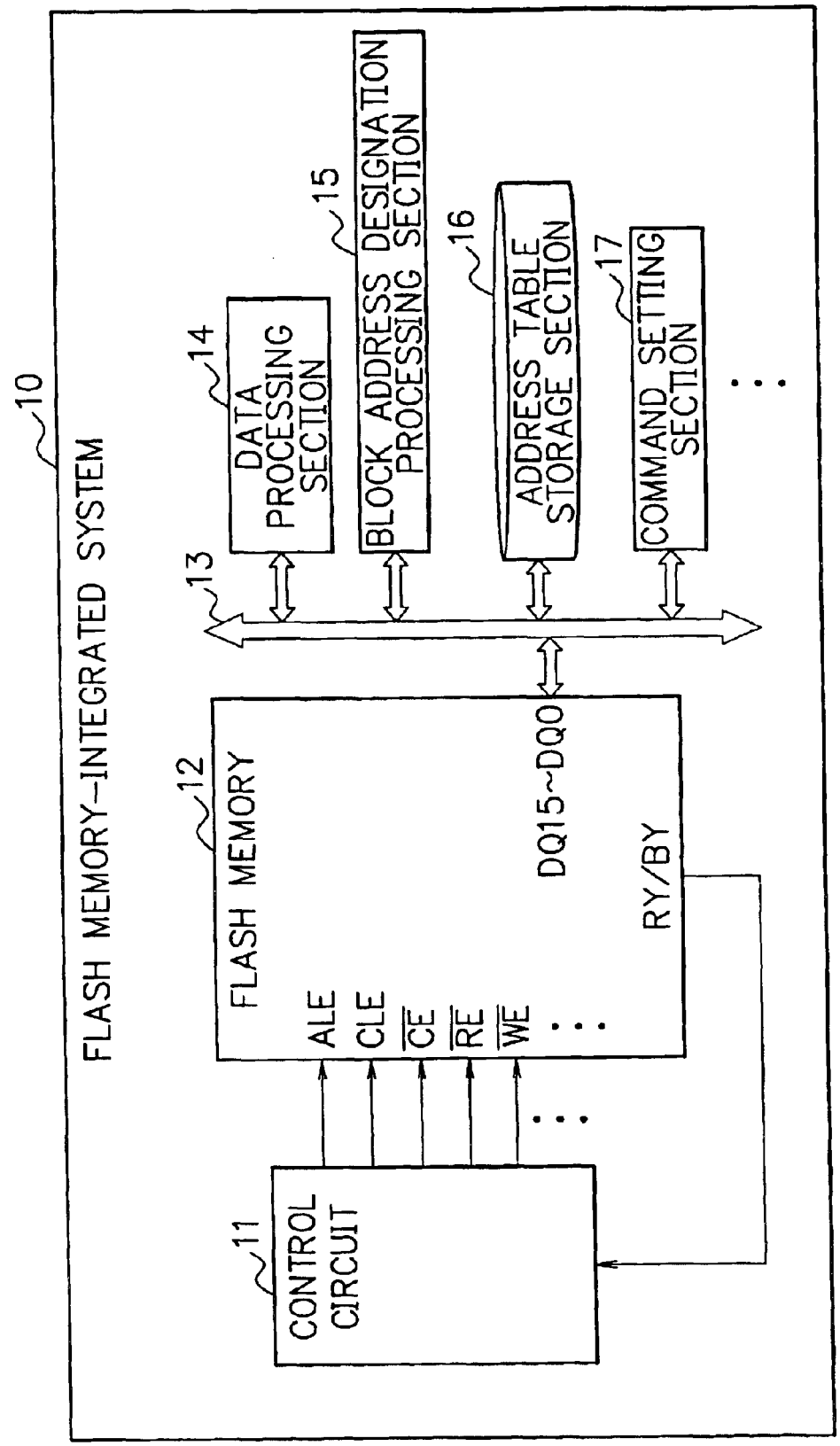
FIG. 1 is a block diagram showing a schematic constitution of a flash memory-integrated system including a flash memory, which is an embodiment of the present invention.

FIG. 1 is a block diagram showing a schematic constitution of the flash memory-integrated system including a flash memory as one embodiment of the present invention. In FIG. 1, a reference numeral 10 denotes a flash memory-integrated system, which includes a flash memory 12, and performs a control of writing, reading, erasing and the like of data for the flash memory 12.

11 denotes a control circuit, and supplies a control signal for performing a control of writing, reading, erasing and the like of the data for the flash memory 12. As kinds of the control signals, signals as shown below are cited as typical ones, which have the same names as the names of terminals of the flash memory 12. An ALE (address latch enable) signal is a signal for controlling processing of taking address data and input/output data into an address register 22 and an input/output register 29 that will be described later inside the flash memory 12, and is inputted into an "ALE" terminal of the flash memory 12. A CLE (command latch enable) signal is a signal for controlling processing of taking an operation command into a command register 21 that will be described later inside the register 12, and is inputted into a "CLE" terminal of the flash memory 12.

A /CE (chip enable) signal is a signal for selecting the flash memory 12, and is inputted into a "/CE" terminal of the flash memory 12. A /RE (read enable) signal is a signal for outputting the data from the flash memory 12, and is inputted into a "/RE" terminal of the flash memory 12. A /WE (write enable) signal is a signal for taking the data into the flash memory 12, and is inputted into a "/WE" terminal of the flash memory 12. Other than these signals, the control circuit 11 outputs various control signals such as a reset signal and a write protect signal according to functions and terminals the flash memory 12 has.

The flash memory 12 includes a "DQ" terminal with 16 bits from DQ 15 to DQ 0 as a terminal for inputting and outputting the address data and the input/output data. A data bus 13 of 16 bits is connected to the "DQ" terminal. The flash memory 12 further includes an output terminal "RY/BY" for outputting an RY/BY signal which is at a low (L) level when the operation is in the busy state in which automatic algorithm or the like is under execution, and is at a high (H) level when the operation is in the ready state in which it is possible to accept a reading/writing or erasing operation. The RY/BY signal is inputted into the control circuit 11.

14 denotes a data processing section, which performs processing of the data read out from the flash memory 12 via the data bus 13. 15 denotes a block address designation processing section, which generates a block address (block determining information) as information for determining a block to be accessed, which is inputted into the flash memory 12.

16 denotes an address table storage section, which stores the block address generated by the block address designation processing section 15 as an address table of defective blocks (defective block determining information) which a defective block is detected in the flash memory 12 that will be described later. The flash memory-integrated system 10 avoids access to a defective block by referring to the address table of the defective block from this address table storage section 16.

17 denotes a command setting section, which generates command data as a command to set various operation modes in the flash memory 12. In this embodiment, the command setting section 17 has at least a function of generating command data for setting a plurality of normal operation modes (writing mode, reading mode, data transfer command and the like) for the flash memory 12 to perform normal operations (writing, reading and the like), command data for setting a status data reading mode (read status command) for reading the status data of the flash memory 12, and command data for setting a defective block detection mode defective block detection command for detecting the defective blocks into the flash memory 12.

As described above, the flash memory integrated-system 10 controls the flash memory 12 by the control circuit 11 to make it possible to write in and read out arbitrary data. By storing the block address of the defective block in the address table storage section 16, the flash memory-integrated system 10 can manage the access to the defective block. The flash memory 12 is a nonvolatile memory, and therefore written data can be stored even if the power supply of the flash memory-integrated system 10 is turned off. Namely, when the address table storage section 16 is constituted of a volatile memory, the information of the address table stored in the address table storage section 16 may be stored in a predetermined region of the flash memory 12.

Next, a schematic constitution of the aforementioned flash memory 12 will be explained with use of the drawing. FIG. 2 is a block diagram showing the schematic constitution of the flash memory 12 shown in FIG. 1. In FIG. 2, a reference numeral 20 denotes a control circuit, which controls each processing and flow of the data inside the flash memory 12 based on the ALE signal, CLE signal, /CE signal, /RE signal, /WE signal and the like, which are the control signals from the outside (external control signals) and the command data stored in the command register 21 that will be described later. The control circuit 20 is connected to a page buffer circuit 26, a detection circuit 28, an input/output register and buffer 29 and a high voltage generation circuit 30, which will be described later, and mainly controls these circuits. The control circuit 20 has a function for initializing the circuits requiring initialization when performing switching of the aforementioned operation modes (normal operation mode, status data reading mode, and defective block detection mode).

The control circuit 20 includes an output control section 20*a* for outputting result data of the detection processing of the defective block from the "DQ" terminal in response to falling (first change) of the /RE signal or the like inputted from the outside. Further, the control circuit 20 includes an address addition processing section 20*b* for finishing outputting of the detection result from the "DQ" terminal in response to rising (second change) of the /RE signal inputted from the outside, and incrementing the address for determining the block.

21 denotes a command register, which takes in the command data inputted via the "DQ" terminal, the input/output register and buffer 29, and a data bus 33 in timing of the control signals from the outside (/CE signal, /RE signal, /WE signal), retains the data, and outputs the data to the control circuit 20.

22 denotes an address register, which retains the address data inputted via the "DQ" terminal, the input/output register and buffer 29, and the data bus 33. The address register 22 outputs the retained address data to a data bus 31. 23 denotes a status register, which retains status data that is the data indicating the state of the flash memory 12. 24 denotes a memory cell array, which has a constitution in which a plurality of memory cells connected in series are aligned. The detailed explanation of the memory cell array 24 and its peripheral circuits will be made later.

25 denotes a Y decoder, which is a circuit for selecting a bit line based on the address data. The address data is inputted into the Y decoder 25 from the address register 22 via the data bus 31. The Y decoder 25 has the function of bypassing the data to be written in or read out of the memory cell array 24, and is connected to the input/output register and buffer 29 that will be described later via a data bus 32.

26 denotes a page buffer circuit, which reads out data from the memory cell array 24 by the page unit from the memory cell array 24 and latches it. The page buffer circuit 26 has the function of a sense amplifier for pre-charging the bit line selected by the Y decoder. Details of the page buffer circuit 26 will be described later.

27 denotes an X decoder, which selects a word line and a signal line for controlling select gates 41 and 43 that will be described later based on the address data. The address register 22 and the X decoder 27 realize a block determining function for determining a block based on the address data. The address data is the data including the block addresses.

28 denotes a detection circuit, which detects whether the data can be erased in an erasure verifying operation, and detects a defective block in the aforementioned defective block detection mode, by outputting a signal that is the inverted logical sum of all the output lines of the page buffer circuit 26. 29 denotes the input/output register and buffer, which controls input and output of the data from and to the outside via the "DQ" terminal that is the input/output terminal. The input/output register and buffer 29 is connected to the data buses 32 and 33 inside the flash memory 12 and also connected to the data bus 13 of the outside via the terminal "DQ".

30 denotes a high voltage generation circuit, which applies high voltage to the word line and the like connected to the gate electrodes of the memory cells when data writing and data erasure are performed for the memory cells. An operation of the high voltage generation circuit 30 is controlled by the control circuit 20. The control circuit 20, the high voltage generation circuit 30 and the X decoder 27 realize a memory cell controlling function for driving the word line connected to each memory cell.

According to the constitution described above, the flash memory 12 performs writing to the data of the memory cell array 24, reading and erasure of data, and the like based on the control signals from the outside and the command data. When a defective block exists inside the memory cell array 24, the flash memory 12 operates in the defective block detection mode, and thereby it can detect the defective block. When the flash memory 12 operates in the defective block detection mode, "0" data (hereinafter, referred to as flag data) is written in part of the defective block of the memory cell array 24, and all the memory cells of the normal blocks have "1" data. Accordingly, the flash memory 12 performs detection of the defective block based on the flag data.

Next, a schematic constitution of the memory cell array 24 and its peripheral circuits will be explained with use of the drawing.

Figure 3:
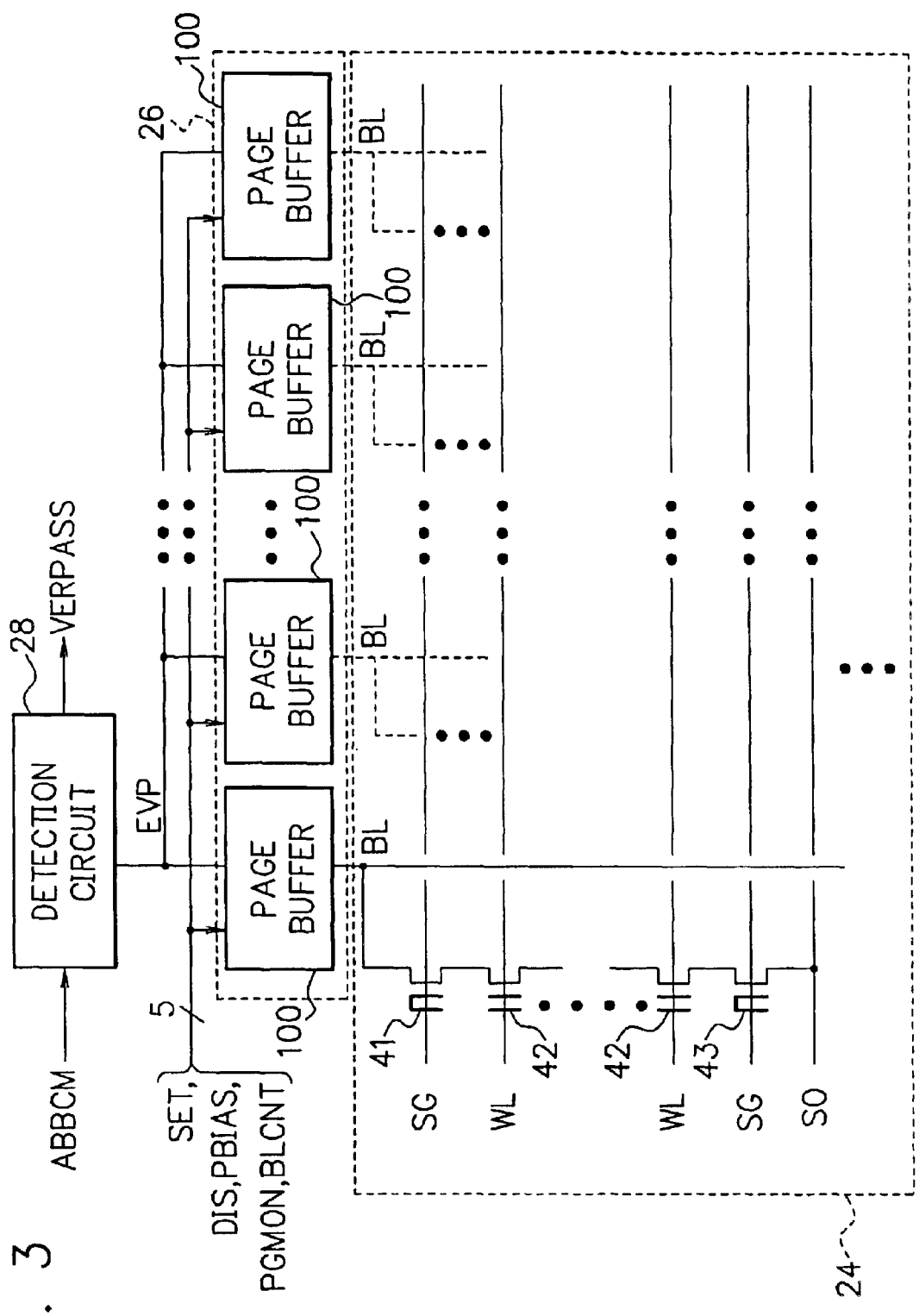
FIG. 3 is a diagram showing schematic constitutions of a memory cell array 24 and peripheral circuits shown in FIG. 2.

FIG. 3 is a diagram showing the schematic constitution of the memory cell array 24 and its peripheral circuits shown in FIG. 2. As shown in FIG. 3, the page buffer circuit 26 is constituted of page buffers 100 each connected to each bit line BL. Control signals SET, DIS, PGMON, PBIAS, and BLCNTL (5-bit signals) from the control circuit 20 shown in FIG. 2 are inputted in each page buffer 100. The SET is the signal for latch timing. The DIS and PGMON are the signals for initializing the page buffer 100. The PGMON is the signal for controlling writing the data into the memory cell. The PBIAS is the signal for controlling an operation of the page buffer 100 pre-charging the bit line BL. The BLCNTL is the signal for controlling connection of the page buffers 100 and the bit lines BL. An output line EVP of each page buffer 100 is merged into one output line by a wired OR and connected to the detection circuit 28. Namely, the logical sum of the signals outputted to the output lines EVP of the respective page buffers 100 is inputted into the detection circuit 28.

Logical sum of a control signal ABBCM from the control circuit 20 shown in FIG. 2 and the signals outputted to the output lines EVP of the respective page buffers 100 is inputted into the detection circuit 28. The ABBCM is the signal which rises when the defective block detection command is started, and falls when it is finished. The output line of the detection circuit 28 is connected to the status register 23 shown in FIG. 2. Namely, an output signal VERPASS of the detection circuit 28 is stored in the status register 23 shown in FIG. 2. Accordingly, by executing a read status command, the detection result of the detection circuit 28 is outputted outside the flash memory 12 as part of status information.

41 denotes a select gate (first select gate), which is constituted of an n-type MOS (Metal-Oxide Semiconductor) FET (Field-Effect Transistor). The bit line BL is connected to a drain terminal of the select gate 41. A source terminal of the select gate 41 is connected to a drain terminal of a memory cell 42 at a side of the bit line BL, which is an end of a memory cell string. A gate terminal of the select gate 41 is connected to an output line of the X decoder 27, and has a control signal SG inputted therein.

As for the memory cells 42, 16 memory cells 42 are connected in series, each source terminal and drain terminal thereof are connected to each other. The source terminal of the memory cell 42 at the side of a source line SO being the other end of the memory cell string is connected to the source line SO via the select gate (second select gate) 43. The select gate 43 is also constituted of the n-type MOS FET as the select gate 41, and has the control signal SG inputted into a gate terminal thereof. The select gates 41 and 43 are generated by connecting the floating gate and the control gate of the memory cell 42. Though voltage applied to the source line SO is 0V in this embodiment, this is not restrictive, and it is preferable to apply any voltage if only it is from the voltage equal to or less than the pre-charged voltage into the bit line BL to 0V.

The memory cells 42 shown in FIG. 3 represent one block of memory cells. The bit lines BL in FIG. 3 represent 528 of the bit lines, and one page of the memory cells 42 and the page buffers 100 include 528 of the memory cells and the page buffers. Since one block=16 pages, 528×16 of memory cells 42 exist in one block. In one bank of memory cell arrays 24, 1024 blocks exist. The flash memory 12 in this embodiment has two banks. According to the constitution described above, the flash memory 12 reads out the flag data indicating defective blocks included in the memory cell arrays 24 to the page buffers 100, and detects the presence or absence of the flag data by the detection circuit 28.

Next, an example of the circuit constitution of the aforementioned page buffer 100 will be explained with use of the drawing.

Figure 4:
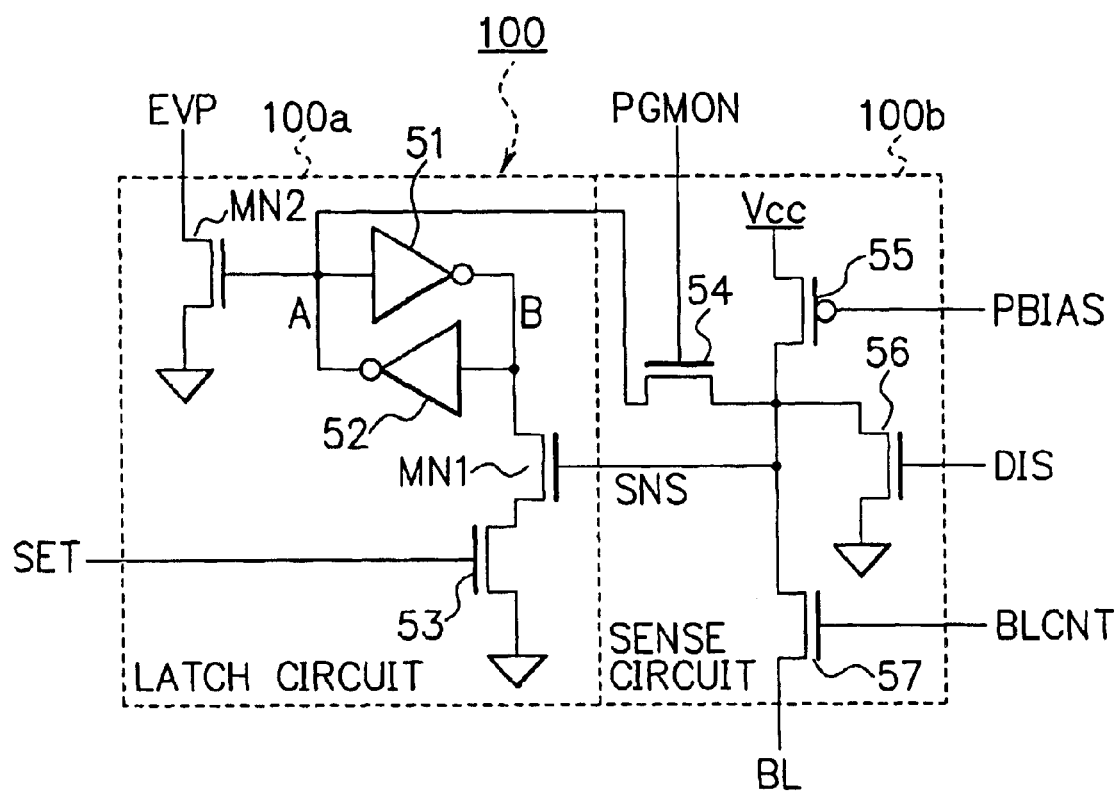
FIG. 4 is a diagram showing a circuit constitution example of a page buffer 100 shown in FIG. 3.

FIG. 4 is a diagram showing an example of the circuit constitution of the page buffer 100 shown in FIG. 3. As shown in FIG. 4, the page buffer 100 is constituted of a latch circuit 100a and a sense circuit 100b. The latch circuit 100a includes transistors MN1 and MN2, a latch section constituted of inverters 51 and 52, and a transistor 53. The sense circuit 100b includes transistors 54, 55 56 and 57. The transistors MN1, MN2, 53, 54, 56 and 57 are n-type MOS FETs and the transistor 55 is a p-type MOS FET.

First, the circuit constitution of the sense circuit 100b will be explained. A source terminal of the transistor 55 is connected to a power supply voltage Vcc. The control signal PBIAS shown in FIG. 3 is inputted into a gate terminal of the transistor 55. A drain terminal of the transistor 55 is connected to the bit line BL via the transistor 57. The control signal BLCNT shown in FIG. 3 is inputted into a gate terminal of the transistor 57. An interconnection point of the transistor 55 and the transistor 57, and a ground are connected via the transistor 56. The control signal DIS shown in FIG. 3 is inputted into a gate terminal of the transistor 56.

The interconnection point of the transistor 55 and the transistor 57, and a gate terminal of the transistor MN2 are connected via the transistor 54. The control signal PGMON shown in FIG. 3 is inputted into a gate terminal of the transistor 54. The interconnection point of the transistor 55 and the transistor 57, and a gate terminal of the transistor MN1 are connected, and this signal line is referred to as SNS.

According to the above constitution, the sense circuit 100b initializes the latch circuit 100a according to rising of the control signals PGMON and DIS, and applies the power supply voltage Vcc to the bit line BL according to rising of the control signal BLCNT and falling of the control signal PBIAS. A change in the voltage pre-charged in the bit line by the memory cell 42 shown in FIG. 3 is outputted to the latch circuit 100a by the signal line SNS.

Next, the circuit constitution of the latch circuit 100a will be explained. The transistor MN2 connects the output line EVP of the page buffer 100 and the ground. The gate terminal of the transistor MN2 is connected to an input terminal of the inverter 51 and an output terminal of the inverter 52. An output terminal of the inverter 51 and an input terminal of the inverter 52 are connected to each other. An interconnection point of the output terminal of the inverter 51 and the input terminal of the inverter 52 is connected to the ground via the transistor MN1 and the transistor 53. The control signal SET shown in FIG. 3 is inputted into a gate terminal of the transistor 53. An interconnection point of the input terminal of the inverter 51 and the output terminal of the inverter 52 is referred to as A, and the interconnection point of the output terminal of the inverter 51 and the input terminal of the inverter 52 is referred to as B. The output line EVP is normally kept at a high level.

According to the circuit constitution shown above, in the latch circuit 100a, an initializing signal (low level) is inputted into the interconnection point A (hereinafter, referred to as the node A) from the sense circuit 100b, and thereby the interconnection point B (hereinafter, referred to as the node B) is at a high level. As a result of the above, the latch circuit 100a is initialized. It is determined whether the latch circuit 100a is connected to the ground or not correspondingly to an output signal of the signal line SNS according to rising of the control signal SET. Namely, when the signal line SNS is at a low level, the signal levels of the nodes A and B also remain in the initialized state, and the output line EVP of the latch circuit 100a remains at a high level. When the signal SNS is at a high level, the signal levels of the nodes A and B are inverted from the initialized state and the transistor MN2 is activated. Thereby, the output line EVP of the latch circuit 100a is changed to a low level.

Next, an example of the circuit constitution of the aforesaid detection circuit 28 will be explained with use of the drawing.

Figure 5:
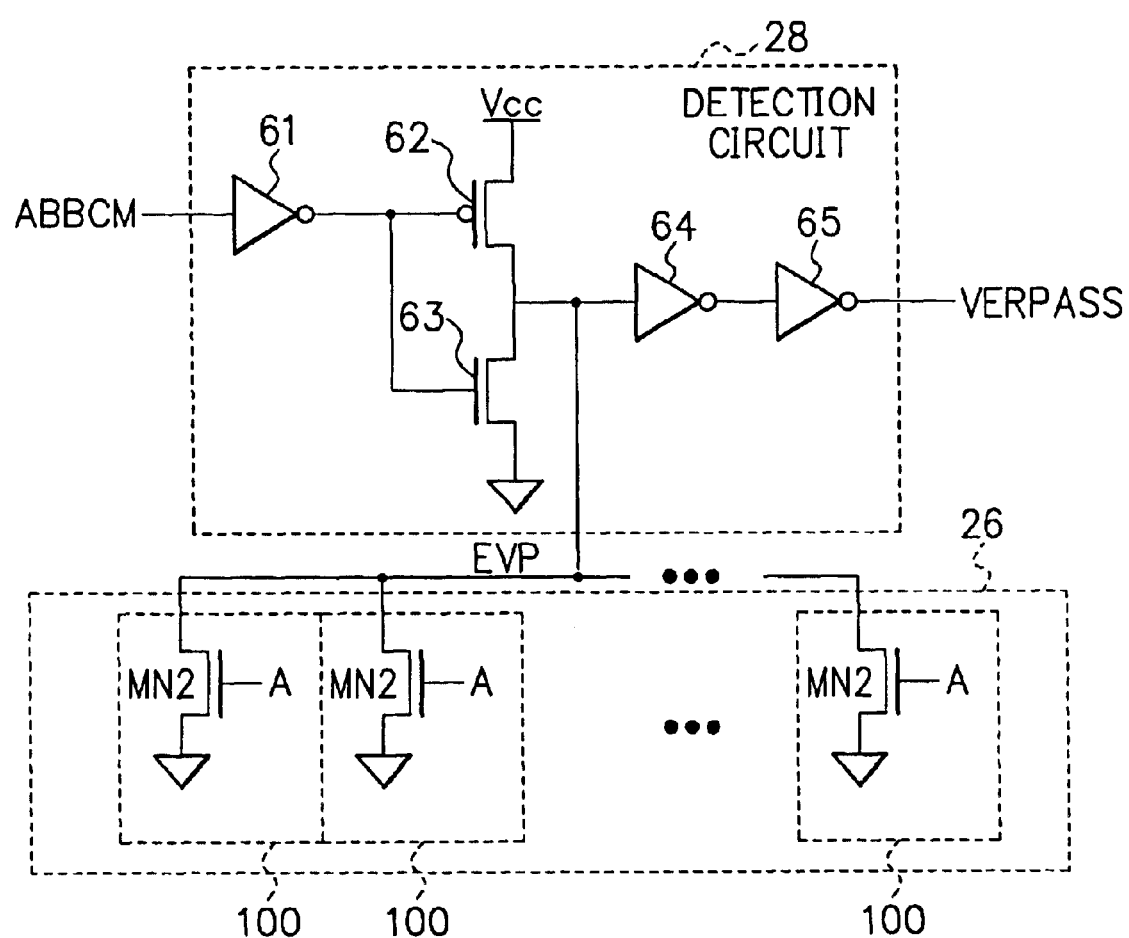
FIG. 5 is a diagram showing a circuit constitution example of a detection circuit 28 shown in FIG. 3.

FIG. 5 is a diagram showing the example of the circuit constitution of the detection circuit 28 shown in FIG. 3. As shown in FIG. 5, the detection circuit 28 includes inverters 61, 64, and 65, and transistors 62 and 63. The transistor 62 is a p-type MOS FET, and the transistor 63 is an n-type MOS FET. Each of the page buffers 100 in FIG. 5 is the simplified drawing of FIG. 4.

The control signal ABBCM shown in FIG. 3 is inputted into an input terminal of the inverter 61. An output terminal of the inverter 61 is connected to gate terminals of the transistors 62 and 63. A source terminal of the transistor 62 is connected to a power supply voltage Vcc. A drain terminal of the transistor 62 is connected to a drain terminal of the transistor 63. A source terminal of the transistor 63 is connected to the ground. An interconnection point of the transistor 62 and the transistor 63 is connected to an output line via the inverters 64 and 65, and outputs the detection signal VERPASS. The interconnection point of the transistor 62 and the transistor 63 is connected to the output line which is the result of combining the output lines EVP of all (one block of) the page buffers 100 into one line with the wired OR.

According to the constitution described above, when the transistors MN2 of all the page buffers 100 are off (when the flag data indicating defective does not exist in the block), the detection circuit 28 outputs the control signal ABBCM (high level) at the as-is level as the detection signal VERPASS. When the transistors MN2 of some of the page buffers 100 are on (when the flag data indicating defective exists in the block), the detection circuit 28 outputs the detection signal VERPASS (low level), which is the inverted control signal ABBCM (high level).

Next, an operation of the aforementioned flash memory-integrated system 10 detecting a defective block of the flash memory 12 will be explained.

FIG. 6 is a flow chart showing the operation of the flash memory-integrated system 10 detecting a defective block of the flash memory 12. As shown in FIG. 6, first, in step S1, the command setting section 17 inputs the command data of the defective block detection command into the "DQ" terminal of the flash memory 12. The block address designation processing section 15 inputs a block address=M (M is an arbitrary integer) for determining the block, which is the target of the detection processing of the defective block, into the "DQ" terminal of the flash memory 12. The value of the aforementioned M is the value indicating the block address at which the detection of the defective block is started.

Details of the aforementioned input processing will be explained below based on a concrete example. The input processing of the command data will be explained. First, the command setting section 17 outputs the command data to the data bus 13. Next, the control circuit 11 raises the CLE signal to a high level, and changes the /WE signal. At this time, the /RE signal is fixed at a high level, and the ALE signal and the /CE signal are fixed at a low level. Thereby, the command data is taken into the command register 21 of the flash memory 12, and the control circuit 20 outputs the control signal corresponding to the command data.

Next, the input processing of the block address will be explained. First, the block address designation processing section 15 outputs the block address=M which it designates to the data bus 13. Next, the control circuit 11 raises the ALE signal to a high level, and changes the /WE signal. At this time, the /RE signal is fixed at a high level, and the CLE signal and the /CE signal are fixed at a low level. Thereby, the block address=M is taken into the address register 22 of the flash memory 12, and the outputs of the Y decoder 25 and the X decoder 27 change, thus selecting the block corresponding to the block address.

Next, in step S2, after waiting of 7 μs by an internal timer, the data read from the block selected with the block address=M is transferred to the page buffer circuit 26. As a result, the detection circuit 28 outputs the detection result of the flag data, and the status register 23 stores it. In step S2, the reason of the waiting of 7 μs is that this is the time taken to transfer the data to the page buffer 100 from the memory cell 42.

Next, in step S3, the command setting section 17 inputs the command data of the read status command to the flash memory 12 via the data bus 13. Thereby, the read register command is set in the command register 21 of the flash memory 12, and the control circuit 20 outputs the control signal corresponding to the command data.

Next, in step S4, the control circuit 11 lowers the /RE signal to a low level so that the detection result stored in the aforementioned status register 23 is read out and outputted from the "DQ" terminal. As a result, the flash memory-integrated system 10 takes the detection result data of the defective block from the flash memory 12 as the status information. The process of the aforementioned step S4 takes about 50 ns as shown in FIG. 6. The processes from step S1 to step S4 are combined as step S0, and the details of the processing inside the flash memory 12 in step S0 will be described later.

Next, when the detection result data shows that the defective block is detected (Yes in step S5), the control is transferred to step S6. The flash memory-integrated system 10 stores the block address designated by the block address designation processing section 15 in step S1 into the address table storing section 16 as the block address of the defective block, and the control is transferred to the next step S7. When the detection result data shows that the defective block is not detected (No in step S5), the control is transferred to step S7. The flash memory-integrated system 10 determines whether the block address=M, which is designated by the block address designation processing section 15 in step S1, is the maximum value (the maximum address) or not.

Here, when the flash memory-integrated system 10 determines that the inputted block address=M is the maximum value (Yes in step S7), the process is ended. When it determines that the block address=M is not the maximum value (No in step S7), the control is transferred to step S8, then the block address designation processing section 15 increments the value M of the block address it designates, and the control is returned to step S1. According to the above operation, the flash memory-integrated system 10 detects the defective block for the flash memory 12.

Here, by showing waveform examples of the control signals on the occasion in which the aforementioned flash memory-integrated system 10 sets the read status command to the flash memory 12 and performs status reading, an operation of the flash memory-integrated system 10 at this time will be explained.

Figure 7:
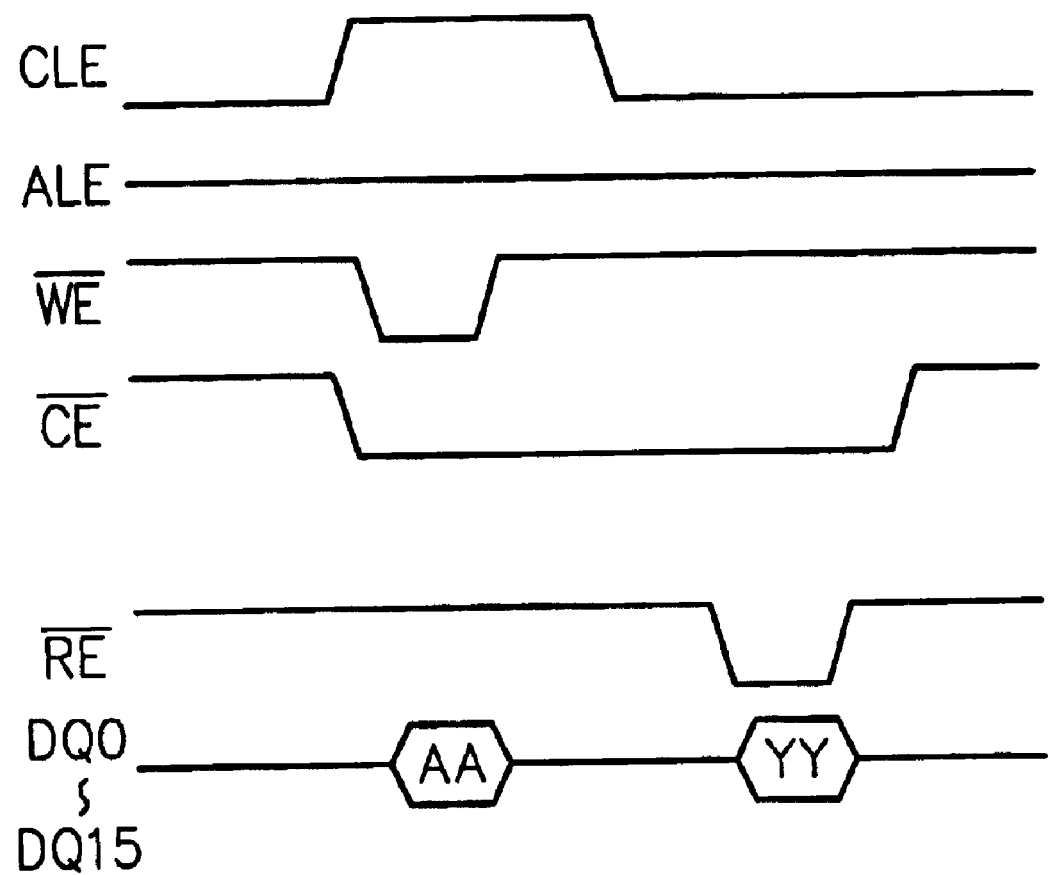
FIG. 7 is a waveform diagram showing a waveform example of a control signal when the flash memory-integrated system 10 in the embodiment of the present invention sets a read status command into the flash memory 12 and performs status reading.

FIG. 7 is a waveform diagram showing the waveform examples of the control signals on the occasion in which the aforementioned flash memory-integrated system 10 sets the read status command into the flash memory 12, and performs status reading. As shown in FIG. 7, first, the control circuit 11 of the flash memory-integrated system 10 raises the CLE signal, and lowers the /CE signal. Next, the control circuit 11 lowers the /WE signal to input the command data "AA" of the read status command into the "DQ" terminal. As a result, the read status command is set in the flash memory 12.

When the control circuit 11 lowers the /RE signal with the read status command being set in the flash memory 12, the status information "YY" is outputted from the "DQ" terminal. 1 bit out of this becomes a signal indicating the detection result of the detection circuit 28. By inputting the control signals described above, the flash memory-integrated system 10 sets the read status command into the flash memory 12, and performs status reading. The other commands are similarly taken and set into the flash memory 12 by inputting the predetermined control signals in predetermined timings.

Next, an operation of the flash memory 12 shown in FIG. 2, corresponding to the process of step S0 (steps S1 to S4) shown in FIG. 6 of the aforementioned flash memory-integrated system 10 will be explained.

Figure 8:
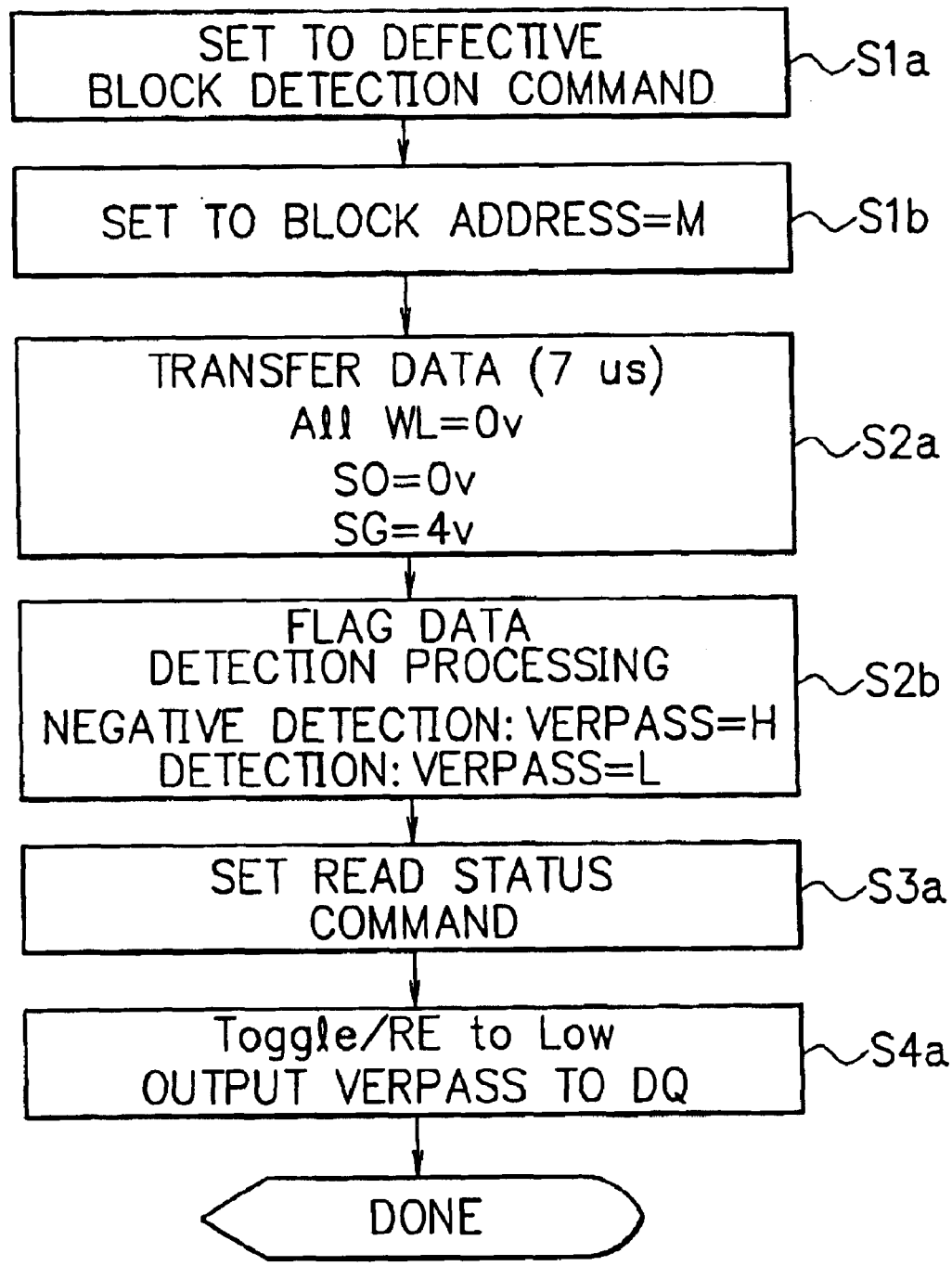
FIG. 8 is a flow chart showing an operation of the flash memory 12 corresponding to processing of the flash memory-integrated system 10 shown in FIG. 6.

FIG. 8 is a flow chart showing the operation of the flash memory 12 corresponding to the processing of the flash memory-integrated system 10 shown in FIG. 6. When the defective block detection command is inputted from the flash memory-integrated system 10 (step S1 of FIG. 6), the command data is taken into the command register 21, whereby the defective block detection command is set (step S1a), as shown in FIG. 8. As a result, the control circuit 20 starts controlling the flow of the data inside the flash memory 12 and the operation of each circuit correspondingly to the defective block detection mode in such a timing as corresponds to the inputted control signal (/Re signal, or the like).

Next, when the block address=M is inputted from the flash memory-integrated system 10 (step S1 in FIG. 6), the block address=M is set into the address register 22 (step S1b). According to this, the Y decoder 25 and the X decoder 27 select the block for which the detection of the flag data indicating whether it is the defective block or not is performed.

Next, on receiving the input of the block address, the control circuit 20 fixes all the word lines WL and the source lines SO at 0V and fixes the control signal SG at 4V for the block selected according to the aforementioned process, as shown in FIG. 8. Next, it transfers the data retained by the memory cell 42 to the page buffer 100 via the select gate 41 (step S2a). According to the above, the page buffer circuit 26 makes the data retained in one block of memory cells 42 the data retained in one page of memory cells 42, and reads and latches it. Details of the process of making the data retained in one page of memory cells 42 and reading it will be described later.

Next, the detection circuit 28 outputs the detection result of detecting whether or not the flag data is included based on the data latched by the page buffer circuit 26 as the output signal VERPASS (step S2b). Here, if the output signal VERPASS is at a high level, it indicates that the flag data is not detected, and if the output signal VERPASS is at a low level, it indicates that the flag data is detected. In other words, if the output signal VERPASS is at a low level, the block is the defective block. The value of the output signal VERPASS of the detection circuit 28 (high or low level) is stored in the status register 23.

Next, when the read status command is inputted by the flash memory-integrated system 10 (step S3 in FIG. 6), the data command is set into the command register 21 (step S3a). Due to this, the control circuit 20 controls the state inside the flash memory 12 such that the data stored in the status register 23 can be read with falling of the /RE signal being the control signal as a trigger. Next, when the flash memory-integrated system 10 lowers the /RE signal being the control signal, the value of the output signal VERPASS (high or low level) of the detection circuit 28 stored in the status register 23 is outputted from the "DQ" terminal (step S4a). As described above, the flash memory 12 performs the detecting operation of the defective block according to the control signal from the flash memory-integrated system 10.

Next, the operations at the circuit level of the aforementioned step S1a to step S4a will be explained with use of the circuit diagrams shown in FIG. 3, FIG. 4, and FIG. 5 and waveform diagrams described below. First, the operation of the circuits when the block which is the target of the process of the aforementioned step S1a to step S4a is not defective blocks will be explained.

Figure 9:
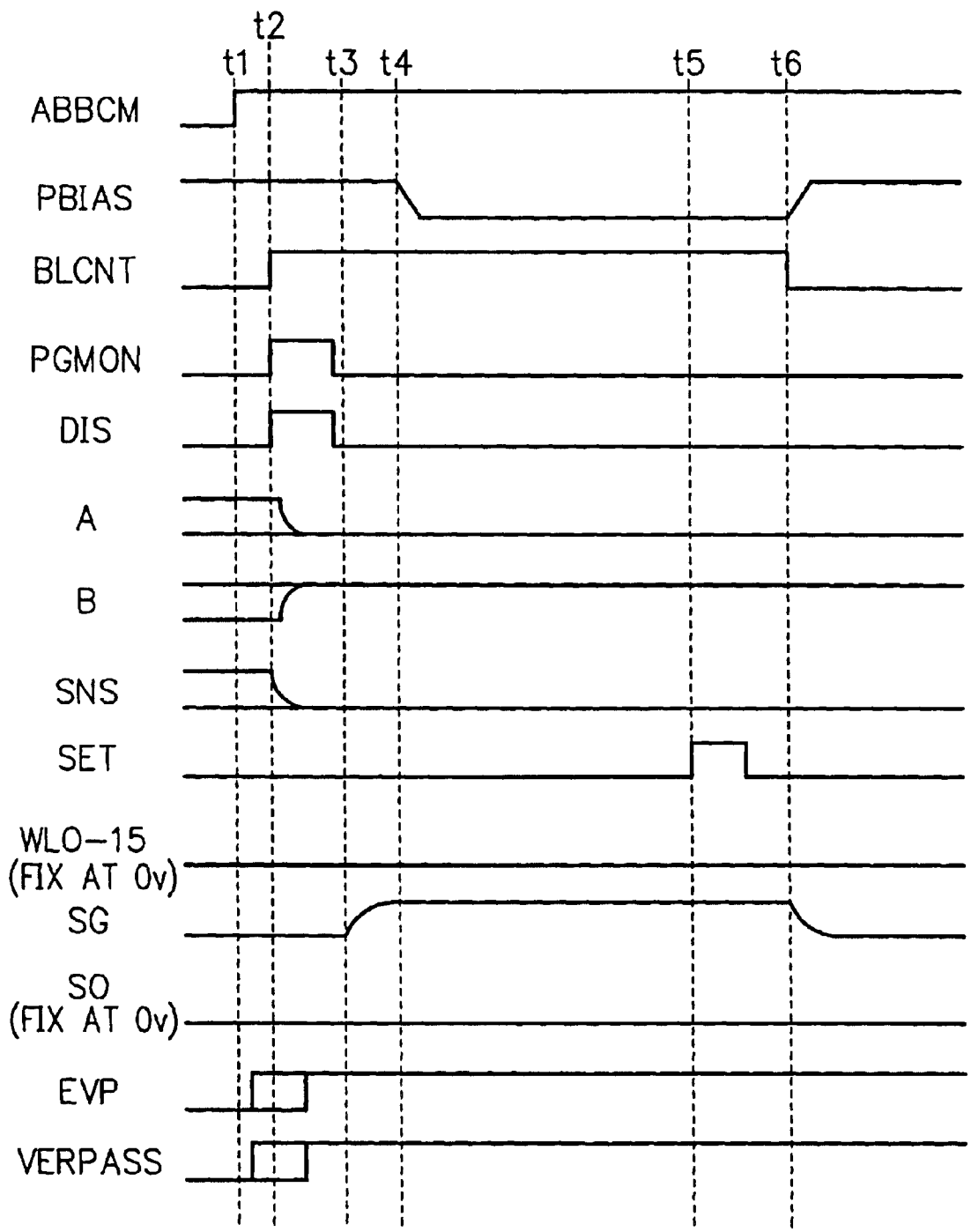
FIG. 9 is a waveform diagram showing a change in a signal at a circuit level in the case in which a block being a target of processing of step S1a to step S4a shown in FIG. 8 is not a defective block.

FIG. 9 is the waveform diagram showing a change in the signals at the circuit level when the block which is the target of the process of step S1a to step S4a shown in FIG. 8 is not the defective block. When the defective block detection command is set in step S1a in FIG. 8 at a timing t1, the control circuit 20 raises the control signal ABBCM. Due to this, the output of the inverter 61 rises, and because the transistor 62 and the transistor 63 constitute the inverter, the output line EVP rises to a high level. Namely, the output line EVP of the page buffer 100 rises to a high level, and via the inverter 64 and the inverter 65, the output line VERPASS of the detection circuit 28 also rises to a high level.

Next, when the block address=M is set in step S1*b* in FIG. 8 at a timing t2, the control circuit 20 raises the control signal PGMON, the control signal DIS and the control signal BLNCT. Due to this, the transistor 54, the transistor 56 and the transistor 57 are on, and the signal line SNS, the node A and the bit line BL are connected to the ground to be a low level. As a result, the node B is at a high level. According to the above, initialization of the page buffer 100 is completed.

Next, at a timing t3, the control circuit 20 fixes all the word lines WL and the source lines SO at 0V for the selected blocks and fixes the control signal SG at 4V as shown in FIG. 3. Due to this, the control signal SG rises. At this time, 16 of the memory cells 42 connected in series to each of the bit lines BL of the non-defective block all retain data 1. Consequently, the bit lines BL are connected to the source line SO (0V) via the select gates 41, 43 and the memory cells 42 to be all at a low level.

Next, at a timing t4, the control circuit 20 lowers the control signal PBIAS. Due to this, the transistor 55 is on, and the power supply voltage Vcc is supplied to the bit line BL via the transistor 57. However, all the bit lines BL are connected to the source line SO via the select gates 41, 43, and the memory cells 42, and therefore the bit lines BL are not pre-charged (remain at a low level). Next, at a timing t5, the control circuit 20 raises the control signal SET. Due to this, the transistor 53 is on, but the transistor MN1 remains off, and therefore the signal level at the node B is not changed. In other words, since the node A remains at a low level, the transistor MN2 remains off, and the output line EVP remains at a high level. According to the above, the signal level of the output line VERPASS of the detection circuit 28 also remains at a high level.

Next, at a timing t6, the control circuit 20 raises the control signal PBIAS, and lowers the control signal BLCNT and the control signal SG. Accordingly, the transistor 55, the transistor 57, and the select gates 41 and 43 are off. Thereafter, the signal level (high level) of the output line VERPASS is stored in the status register 23, and read to the outside from the "DQ" terminal according to the read status command. Due to the above, the flash memory-integrated system 10 can verify that the block designated with the block address inside the flash memory 12 is not the defective block.

Next, the operation of the circuits when the block which is the target of the process in the aforementioned step S1*a* to step S4*a* is the defective block will be explained. At this time, the flag data (0 data) is written into some of the memory cells 42 of the defective block.

Figure 10:
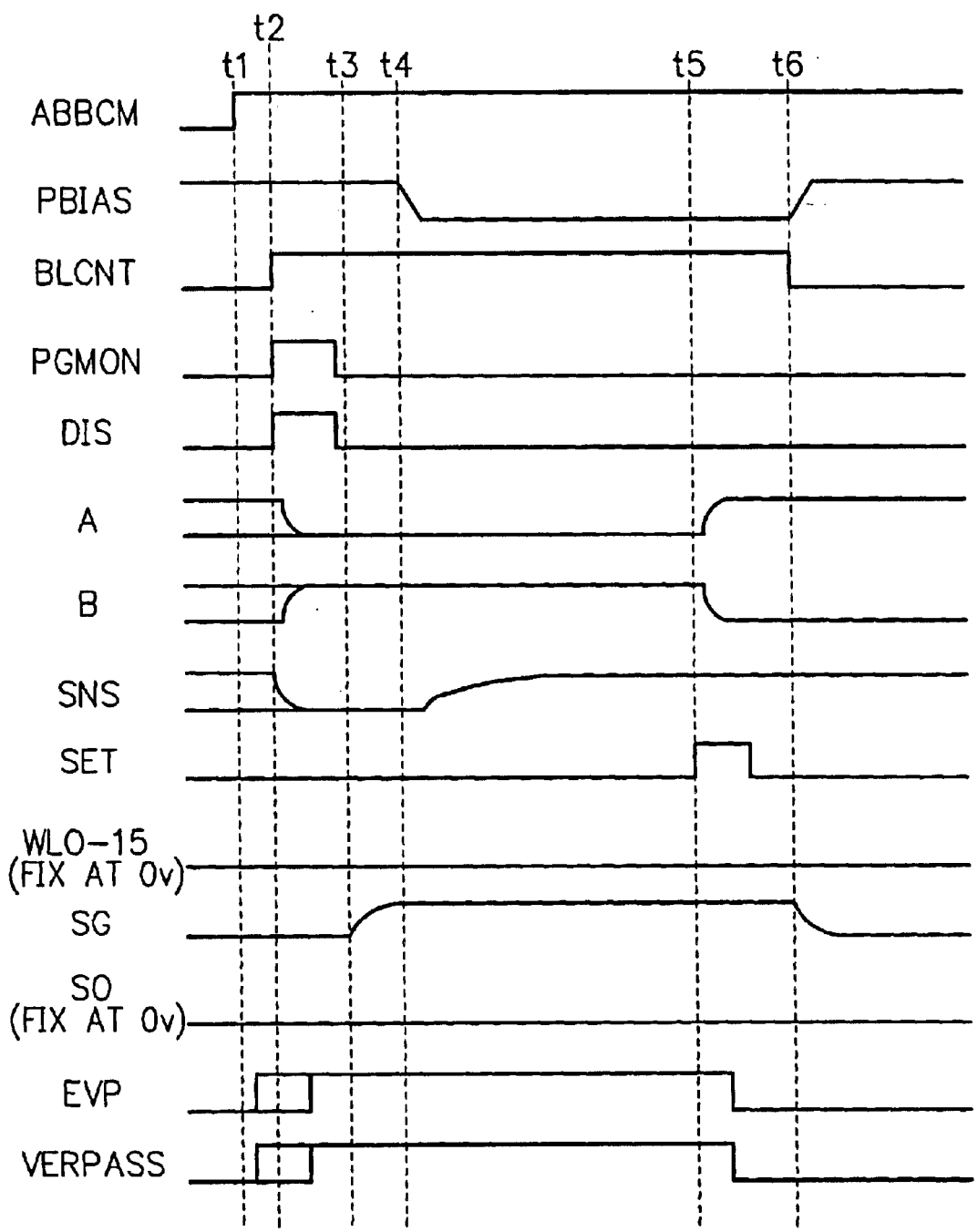
FIG. 10 is a waveform diagram showing a change in a signal at a circuit level in the case in which a block being a target of the processing of step S1a to step S4a shown in FIG. 8 is the defective block.

FIG. 10 is a waveform diagram showing a change in the signals at the circuit level when the block which is the target of the process in step S1*a* to step S4*a* shown in FIG. 8 is the defective block. The waveforms and the circuit operations at the timings t1 to t3 are the same as the waveforms and the circuit operations shown in FIG. 9, and therefore the explanation thereof will be omitted. The case in which 0 data (flag data) is written into some of the memory cells 42 at a point of time at which the process up to the t3 is finished is the different state from the case in FIG. 9, and connection between the bit line BL and the source line SO is interrupted at the spot of the memory cells 42. Both of the lines are at a low level.

Next, at the timing t4, the control circuit 20 lowers the control signal PBIAS. Due to this, the transistor 55 is on, the power supply voltage Vcc is supplied to the bit line BL via the transistor 57. At this time, the bit line BL connected to the memory cell 42 in which the flag data is written is pre-charged to be at a high level. Namely, the signal line SNS is at high level, and the transistor MN1 is on.

Next, at the timing t5, the control circuit 20 raises the control signal SET. As a result, the transistor 53 is on, and the transistor MN1 is also on, whereby the node B is connected to the ground and the signal level is changed to a low level. Due to this, the node A is changed to a high level, and the transistor MN2 is on. As a result, the output line EVP is connected to the ground and changed to a low level. According to the above, the signal level of the output line VERPASS of the detection circuit 28 is also changed to a low level. Namely, the page buffer 100 makes the same data, which is retained in one block of memory cells 42, the data retained in one page of memory cells 42, and reads and latches it. The control circuit 28 detects the signal level of the output line EVP controlled according to the latch signal thereof for the entire page. According to the above, it can be detected whether all the memory cells 42 in the selected block have the same data.

Next, at the timing t6, the control circuit 20 raises the control signal PBIAS, and lowers the control signal BLCNT and the control signal SG. As a result, the transistor 55, the transistor 57, and the select gates 41 and 43 are off. Thereafter, the signal level (low level) of the output line VERPASS is stored in the status register 23, and is read to the outside from the "DQ" terminal in accordance with the read status command. According to the above, the flash memory-integrated system 10 can verify that the block designated with the block address in the flash memory 12 is the defective block.

Here, an operation of the memory cell 42 of the flash memory 12 in the aforementioned defective block detection mode will be further explained in detail.

First, when the command of the defective block detection mode and the block address=M are inputted, the flash memory 12 is in a busy state. When the flash memory 12 is in the busy state, the nodes A of all the page buffers 100 are initialized to be at a low level, and the nodes B are initialized to be at a high level. Next, the processing of reading the data from all the memory cells 42 is carried out.

Since data is not usually written to the non-defective blocks at the time of verification of the defective blocks, the data in all the memory cells 42 is in the state of "1". In this state, threshold voltage (Vt) of the memory cell 42 is negative, and is the transistor in a depletion (normally on) state. Accordingly, when the data is read from the memory cells 42 in the defective block detection mode, all the memory cells 42 in the string of a line of the memory cells 42 (hereinafter, referred to as the string) connected in series to the bit lines BL are on, and the string is brought into conduction. Due to this, the signal line SNS is in the state at a low level. Therefore, even if the control signal SET is changed to a high level, the state of the latch circuit 100*a* is not changed, and the signal levels of the nodes A and B remain at the aforementioned levels.

On the other hand, the memory cell 42 having the flag data is in the state in which "0" is written. In this state, the threshold voltage (Vt) of the memory cell 42 is positive, and is the transistor in an enhancement (normally off) state. Accordingly, when the data is read from the memory cells 42 of the defective block having the flag data according to the defective block detection mode, at least one string is not turned on since the flag data is written therein, and the string is out of conduction. Due to this, the signal line SNS is changed to a high level. Therefore, when the control signal SET is changed to a high level, the node A of the latch circuit 100a is changes to a high level, and the node B is changed to a low level.

As explained above with use of FIG. 6 to FIG. 10, the flash memory-integrated system 10 detects that the block designated with the block address in the flash memory 12 is the defective block by one-time latch of the flag data of some of all the memory cells 42 in one block to the page buffer 100, and further performs detection by one operation from all the page buffers 100 by the detection circuit 28, thus making it possible to reduce the time required for detection process of the defective block significantly. The concrete effect will be described later.

When a plurality of banks exist, all the bank select signals (high-order bits in the block address) are turned on, and detection of the flag data (data transfer) is performed for all the banks at the same time, and detection by the detection circuit 28 is performed for each bank. In this case, the detection result of the detection circuit 28 is divided among the different "DQ" terminals (any of DQ0 to 15) to output it to the outside and correspondence of each terminal (DQ0 to 15) and the bank is previously determined, whereby it is easily determined the defective block of which bank is detected.

Next, another example 2 having a different operation flow from the operation flow of the flash memory-integrated system 10 for detecting the defective block of the flash memory 12 shown in FIG. 6 will be explained.

Figure 11:
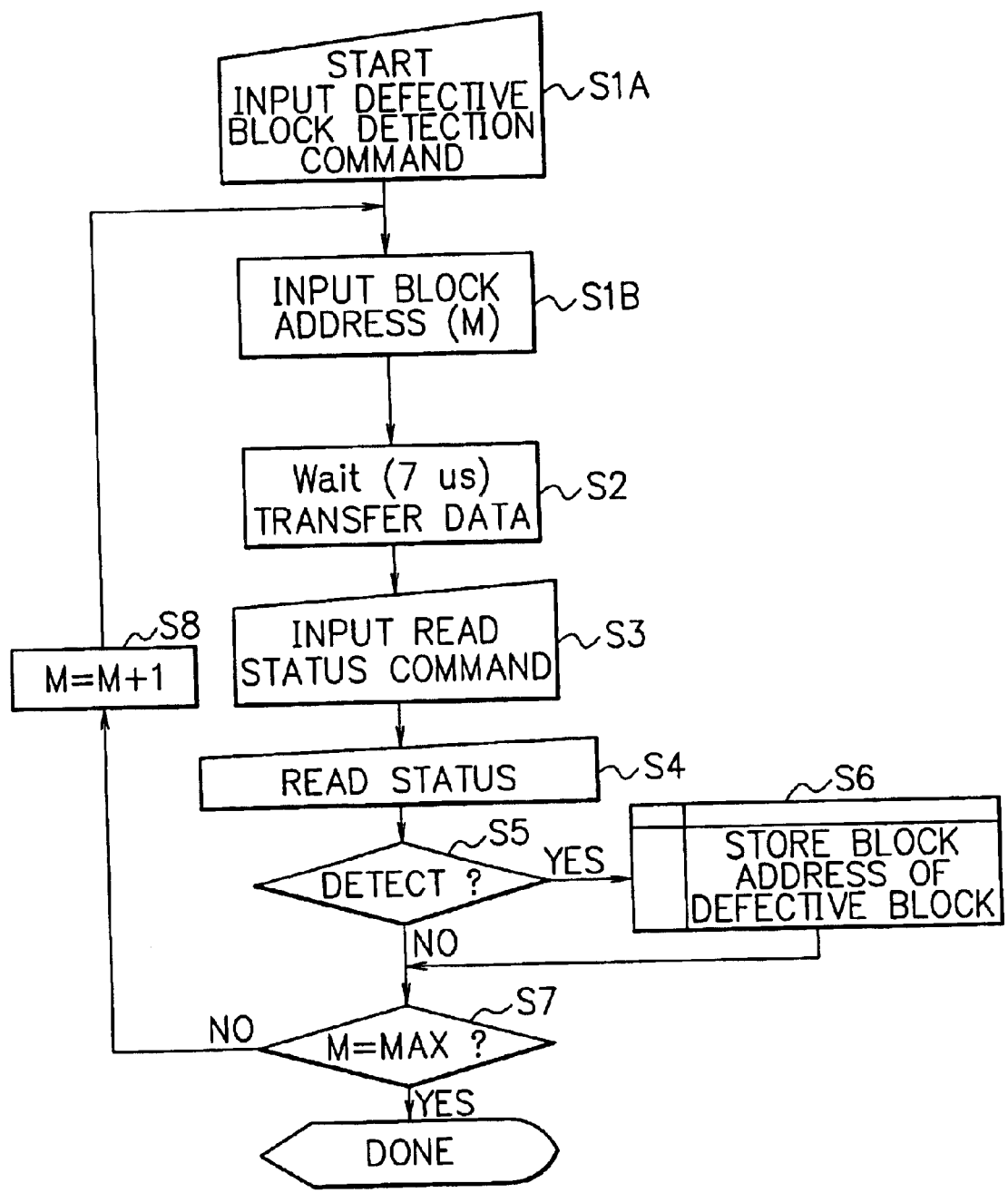
FIG. 11 is a flow chart showing an example 2 different from an operation flow of the flash memory-integrated system 10 for detecting a defective block of the flash memory 12 shown in FIG. 6.

FIG. 11 is a flow chart showing the example 2 different from the operation flow of the flash memory-integrated system 10 for detecting the defective block of the flash memory 12 shown in FIG. 6. In FIG. 11, steps S2 to S8 are the same process as the steps shown in FIG. 6, and therefore the explanation thereof will be omitted.

As shown in FIG. 11, in step S1A, the command setting section 17 inputs the command data of the defective block detection command into the "DQ" terminal of the flash memory 12, first. As a result, the command data of the defective block detection command is taken into the command register 21 of the flash memory 12, and the control circuit 20 starts the control corresponding to the defective block detection command.

Next, in step S1B, the block address designation processing section 15 inputs the block address=M designating the block being the target of the detection processing of the defective block into the "DQ" terminal of the flash memory 12. Due to this, the block address=M is taken into the address register 22 of the flash memory 12, the outputs of the Y decoder 25 and the X decoder 27 are changed, and the block corresponding to the block address is selected.

The following processes in step S2 to step S8 are the same as in FIG. 6, and the control is returned to step S1B after the process of step S8. According to the above operation, the flash memory-integrated system 10 inputs the defective block detection command each time the block address=M is updated in FIG. 6, but in the example 2, the defective block detection command is inputted into the flash memory 12 only once, whereby detection of the defective block can be carried out for all the blocks. Consequently, the processing speed can be enhanced. The flash memory 12 performs the process of the step S1a in FIG. 8 correspondingly to the process of step S1A in FIG. 11, and the flash memory 12 performs processes of step S1b to step S4a shown in FIG. 8 correspondingly to the processes from step S1B to step S4 in FIG. 11.

Next, another example 3 having a different operation flow from the operation flow of the flash memory-integrated system 10 for detecting the defective block of the flash memory 12 shown in FIG. 6 will be explained.

FIG. 12 is a flow chart showing the example 3 different from the operation flow of the flash memory-integrated system 10 for detecting the defective block of the flash memory 12 shown in FIG. 6. In FIG. 12, steps S1 to S2 and steps S5 to S8 are the same processes as the steps shown in FIG. 6, and therefore the explanation thereof will be omitted.

In FIG. 12, when the data is transferred and the detection circuit 28 outputs the detection result in step S2, the detection result data is stored in a predetermined register. Next, when the control circuit 11 lowers the /RE signal to a low level, the flash memory 12 reads the detection result data stored in the aforementioned predetermined register, and outputs it from the "DQ" terminal. As a result, the flash memory-integrated system 10 obtains the detection result data of the defective block from the flash memory 12 (step S3A). The following operations from step S5 to step S8 are as explained with FIG. 6.

According to the above operation, the flash memory-integrated system 10 can output the detection result to the outside by raising the /RE signal in the example 3, while the flash memory-integrated system 10 outputs the detection result data to the outside by utilizing the read status command in FIG. 6. As a result, the speed of the processing can be further enhanced.

Next, the operation of the flash memory 12 corresponding to the processing of step S1 to step S3A shown in FIG. 12 of the aforementioned flash memory-integrated system 10 will be explained.

Figure 13:
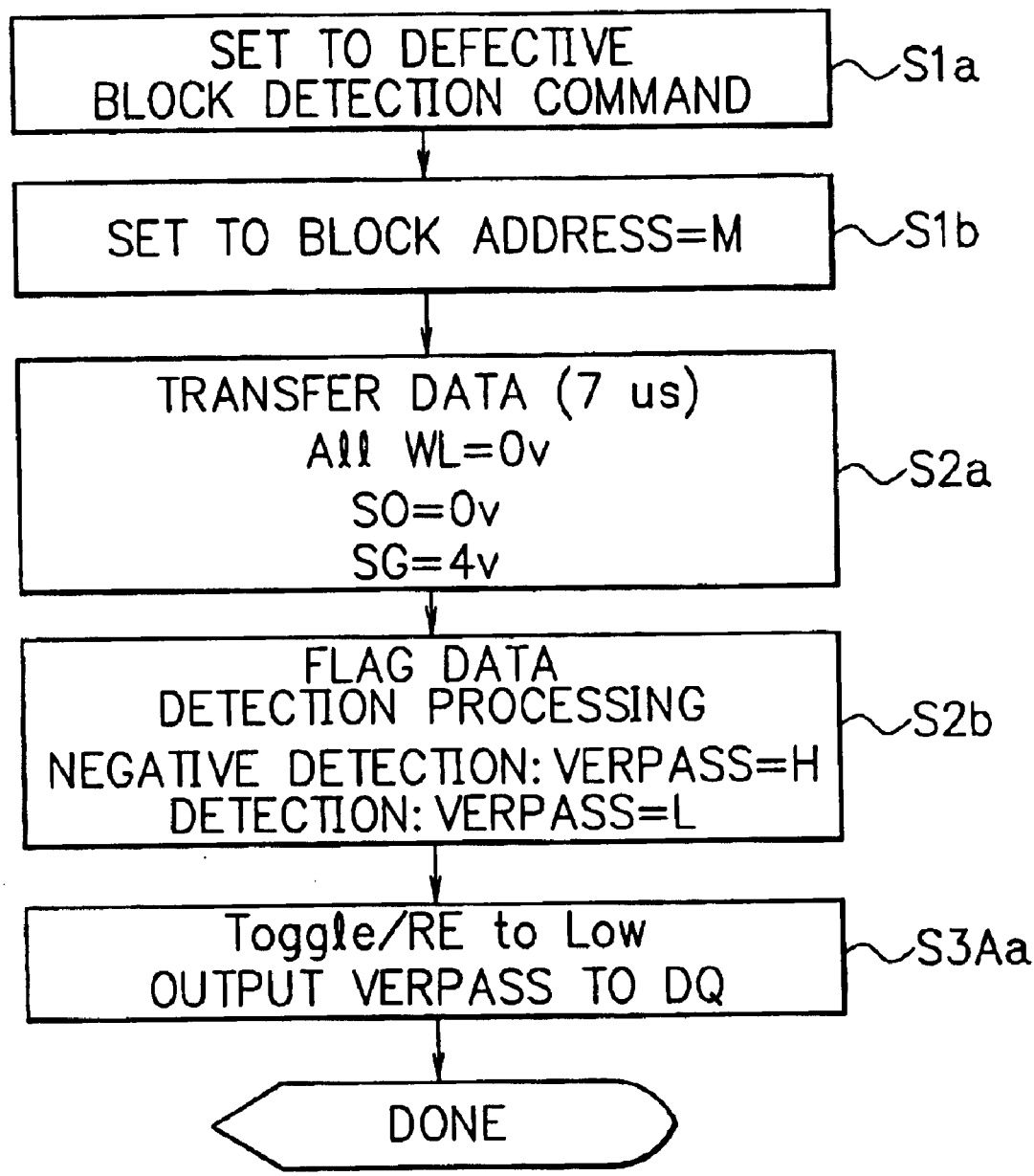
FIG. 13 is a flow chart showing an operation of the flash memory 12 corresponding to the processing of the flash memory-integrated system 10 shown in FIG. 12.

FIG. 13 is a flow chart showing the operation of the flash memory 12 corresponding to the processing of the flash memory-integrated system 10 shown in FIG. 12. In FIG. 13, the processes from steps S1a to S2b are the same as the processes explained in FIG. 8, and therefore the explanation will be omitted. As shown in FIG. 13, in step S3Aa, when the detection processing of the flag data is finished, and the /RE signal for reading the status is inputted from the flash memory-integrated system 10 (step S3A), the detection result data is outputted from the terminal "DQ" by rising of the /RE signal. According to the above, the flash memory 12 can output the detection result without utilizing the read status command.

Next, another example 4 having a different operation flow from the operation flow of the flash memory-integrated system 10 for detecting the defective block of the flash memory 12 shown in FIG. 12 will be explained.

Figure 14:
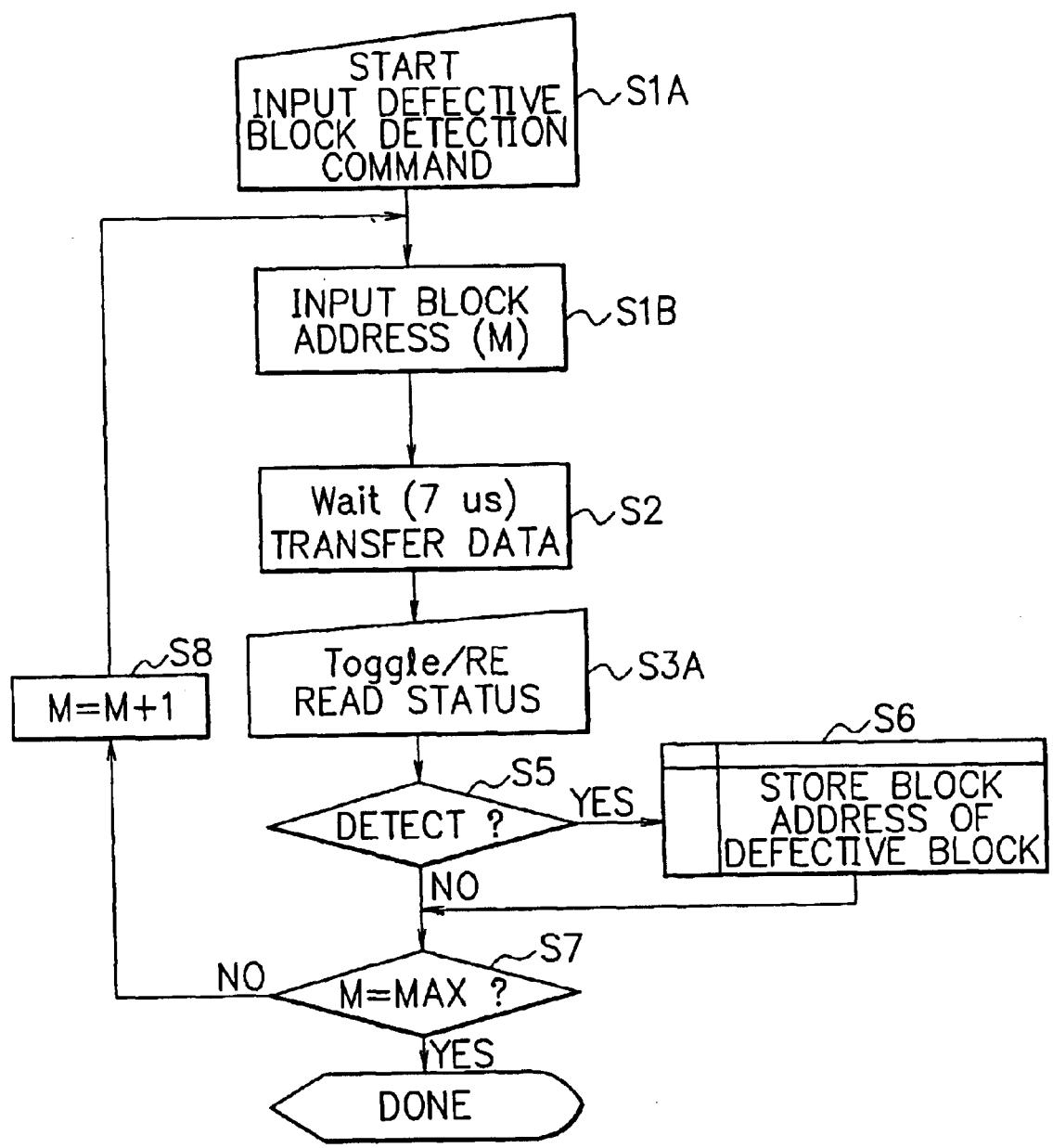
FIG. 14 is a flow chart showing another example 4 of the operation of the flash memory-integrated system 10 detecting the defective block of the flash memory 12 shown in FIG. 12.

FIG. 14 is a flow chart showing another example 4 of the operation of the flash memory-integrated system 10 detecting the defective block of the flash memory 12 shown in FIG. 12. In FIG. 14, the processes in steps S2 to S8 are the same processes as the steps shown in FIG. 12, and therefore the explanation thereof will be omitted. The processes in steps S1A and S1B are the same as the processes shown in FIG. 11.

According to the above, the flash memory-integrated system 10 can perform detection of the defective block for all the blocks if it inputs the defective block detection command into the flash memory 12 only once in the example 4, while the flash memory-integrated system 10 inputs the defective block detection command each time the block address=M is updated in the example 3 in FIG. 12. The flash memory-integrated system 10 outputs the detection result data to the outside by utilizing the read status command in the example 2 in FIG. 11, but in the example 4, it can output the detection result to the outside by raising the /RE signal. As a result, the speed of the processing of defective block detection can be enhanced. The flash memory 12 carries out the process in step S1a in FIG. 13 correspondingly to the process in step S1A in FIG. 14, and the flash memory 12 performs the processes in step S1b to step S3Aa shown in FIG. 13 correspondingly to the processes from the step S1B to step S3A in FIG. 14.

Next, another example 5 having a different operation flow from the operation flow of the flash memory-integrated system 10 for detecting the defective block of the flash memory 12 shown in FIG. 14 will be explained.

Figure 15:
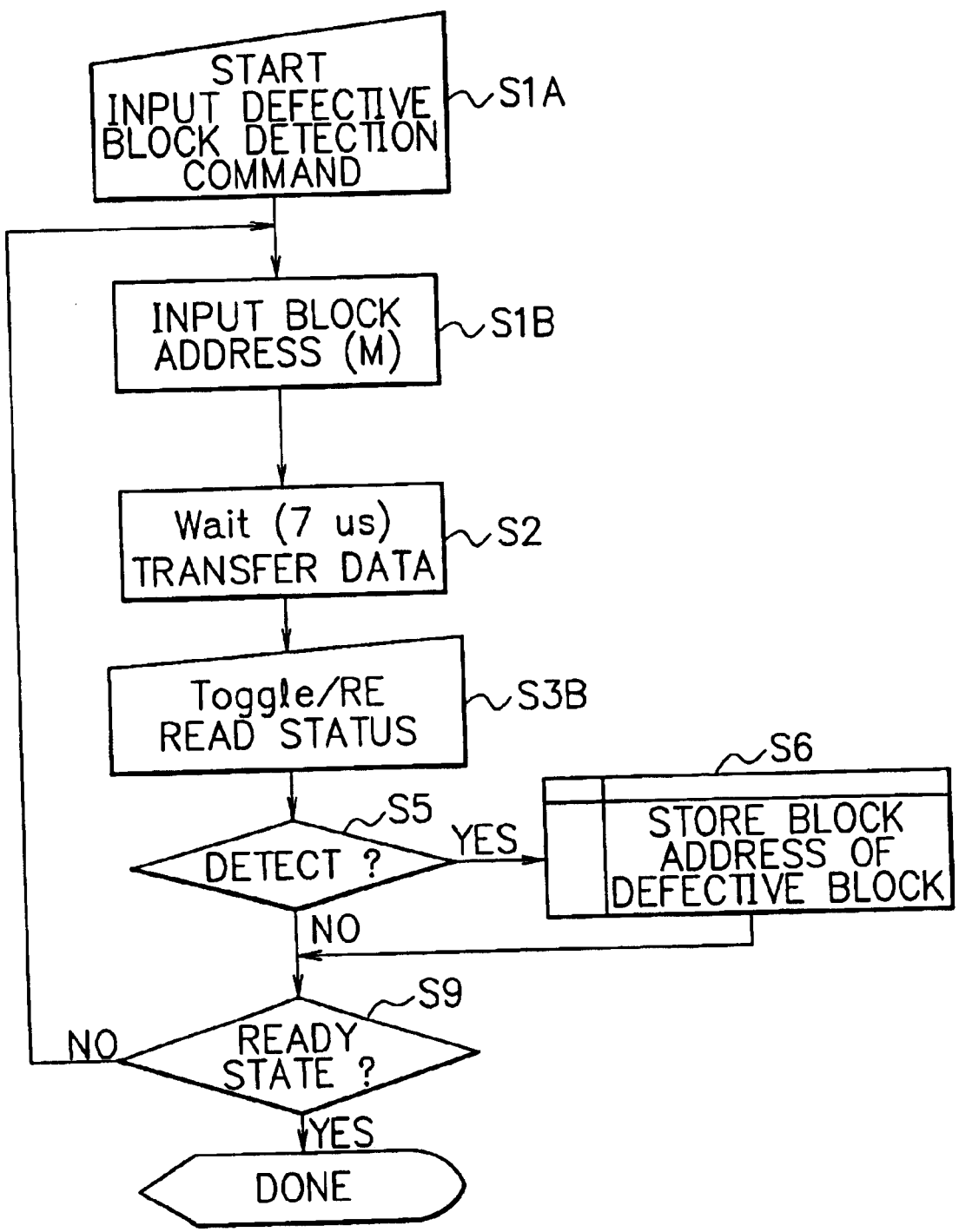
FIG. 15 is a flow chart showing an example 5 different from the operation flow of the flash memory-integrated system 10 for detecting the defective block of the flash memory 12 shown in FIG. 14.

FIG. 15 is a flow chart showing the example 5, which is different from the operation flow of the flash memory-integrated system 10 for detecting the defective block of the flash memory 12 shown in FIG. 14. In FIG. 15, steps S1A to S2 and steps S5 to S6 are the same processes as in the steps shown in FIG. 14, and the explanation thereof will be omitted.

In FIG. 15, when data transfer is performed, and the detection circuit 28 outputs the detection result in step S2, the detection result data is stored in a predetermined register. Next, in step S3B, the control circuit 11 lowers the /RE signal to a low level, whereby the flash memory 12 reads the detection result data stored in the aforementioned predetermined register and outputs it from the "DQ" terminals. As a result, the flash memory-integrated system 10 obtains the detection result data of the defective block from the flash memory 12.

In the example 5, the flash memory 12 includes the function of performing an increment operation of the block address=M, and the flash memory-integrated system 10 only inputs the initial value of the block address into the flash memory 12 in step S1B.

The operation from the following step 5 to step S6 is the same as in FIG. 14. Next, in step S9, the flash memory-integrated system 10 determines the state of the flash memory 12 according to the RY/BY signal outputted from the output terminal "RY/RY" of the flash memory 12. Here, when the flash memory 12 is in the ready state (Yes in step S9), it indicates that the defective block detection inside the flash memory 12 is finished, and therefore the processing of the flash memory-integrated system 10 is also finished. When the flash memory 12 is in a busy state (No in step S9), it indicates that the defective block detection processing is being performed inside the flash memory 12, and therefore the flash memory-integrated system 10 is returned to step S2.

According to the above operation, in the example 5, the flash memory-integrated system 10 only has to input the initial value of the block address into the flash memory 12 because the flash memory 12 includes the function of incrementing the block address, though the flash memory-integrated system 10 performs increment of the block address=M in FIG. 14. As a result, the speed of the detection processing of the defective block can be further enhanced.

Next, an operation of the flash memory 12 corresponding to the processes from step S1A to step S9 shown in FIG. 15 of the aforementioned flash memory-integrated system 10 will be explained.

Figure 16:
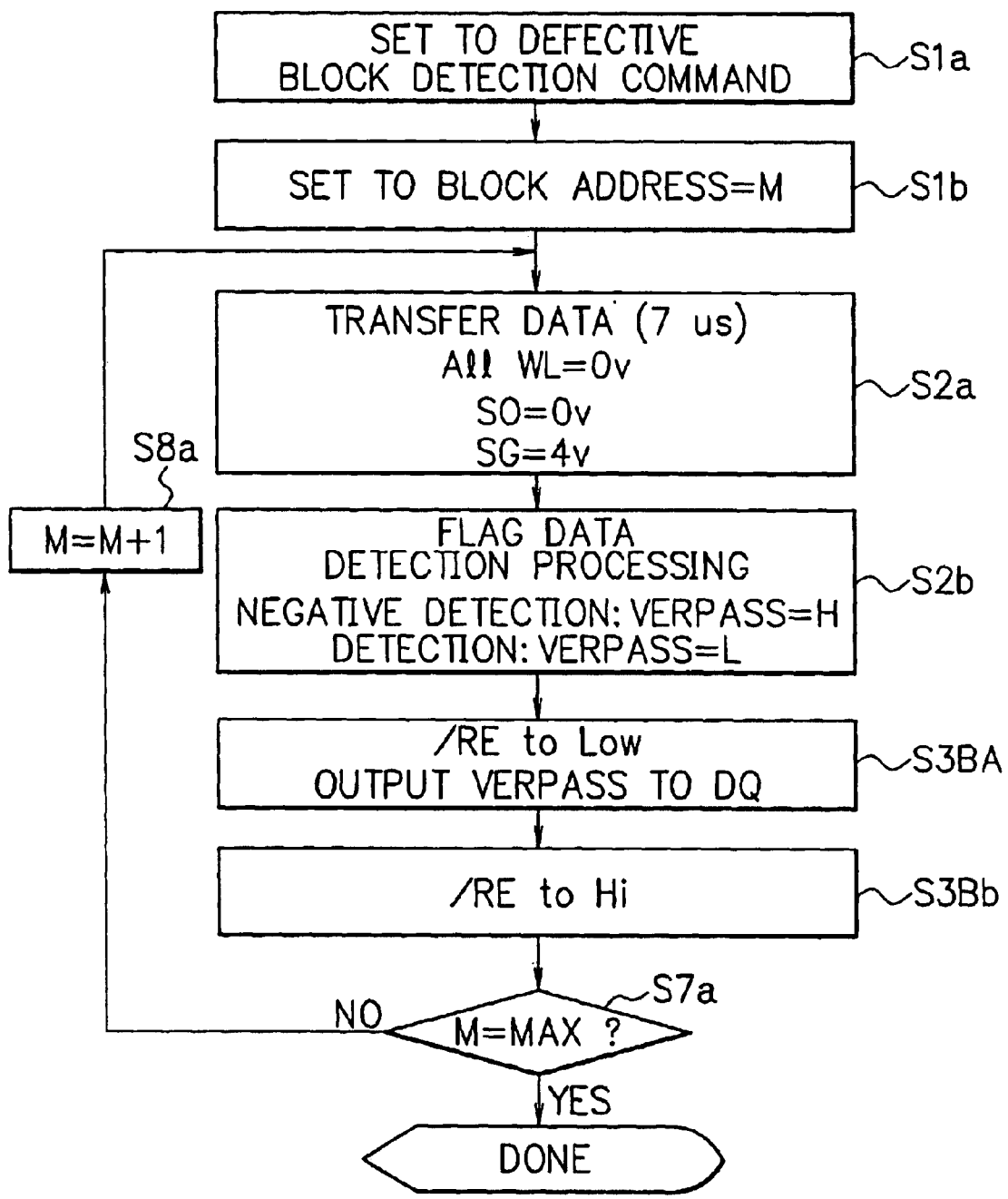
FIG. 16 is a flow chart showing an operation of the flash memory 12 corresponding to the processing of the flash memory-integrated system 10 shown in FIG. 15.
Figure 18:
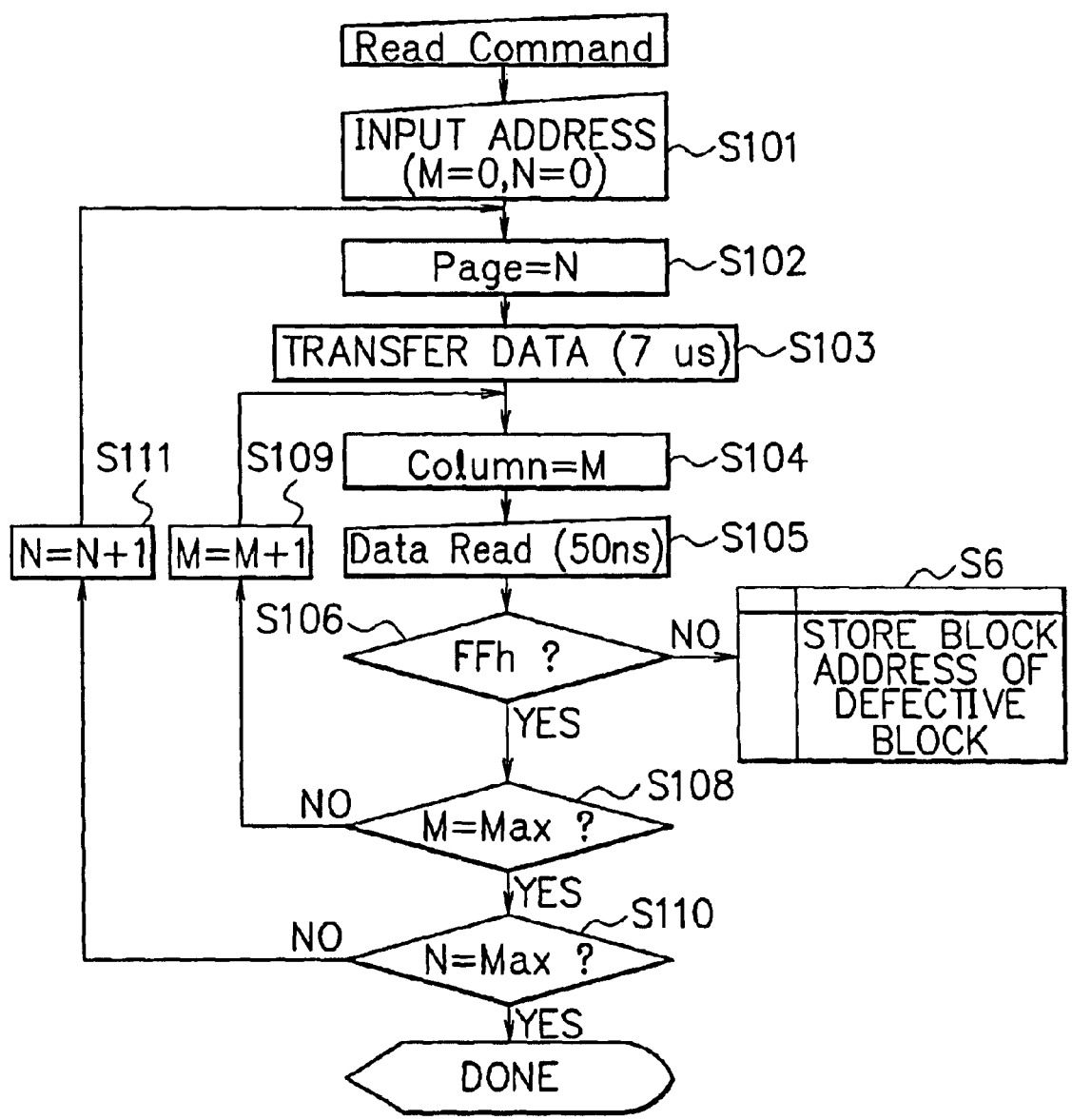
FIG. 18 is a flow chart showing a process of detection of the defective block of a flash memory-integrated system of a prior art.

FIG. 16 is a flow chart showing the operation of the flash memory 12 corresponding to the processing of the flash memory-integrated system 10 shown in FIG. 15. In FIG. 16, the processes from step S1a to S2b is the same as the processes explained in FIG. 8, and therefore the explanation will be omitted.

As shown in FIG. 16, in step S3Ba, when the detection processing of the flag data is finished, and the /RE signal for reading the status is inputted from the flash memory-integrated system 10 (step S3B in FIG. 15), the detection result data is outputted from the terminal "DQ" according to rising of the /RE signal. Next, in step S3Bb, output from the terminal "DQ" is finished according to rising of the /RE signal. Next, in step S7a, the flash memory-integrated system 10 determines whether the block address=M set in step S1b is the maximum value or not.

When it is determined that the block address=M is the maximum value (Yes in step S7a), processing is finished, and the RY/BY signal indicating the ready state is outputted. When it is determined that the block address=M is not the maximum value (No in step S7a), the value M of the block address is incremented (step S8a), and the control is returned to step S2a.

According to the above, the flash memory 12 can perform increment processing of the block address by finishing the output of the detection result at the rising of the /RE signal. As a result, the speed of the detection processing of the defective block can be enhanced. The flash memory 12 performs the process of the step S1a in FIG. 8 correspondingly to the process in step S1A in FIG. 11, and the flash memory 12 performs the processes of step S1b to step S4a shown in FIG. 8 correspondingly to the processes of step S1B to step S4 in FIG. 11.

Time required for the process of detecting the defective block of the flash memory 12 by the aforementioned flash memory-integrated system 10 is compared with that of the conventional defective block detecting method.

FIG. 17 is a comparison table of the detection time required for detection of the defective block in the flash memory between the prior art and the present embodiment. A flash memory used for comparison has the same memory constitution as the aforementioned flash memory 12, and is a flash memory with 64 Mbits and 2 banks. As shown in FIG. 17 (as explained in the prior art), calculation is performed as follows.

Time taken to transfer the data to the page buffer from the memory cell is 7 us per page, and therefore the transferring time is $7\ \mu s \times 16 \times 1024 = 115$ ms.

The amount of data per page is 528 Bytes and the serial access cycle is 20 MHz (50 ns/Byte), and therefore the data reading time is $0.05\ \mu s \times 528 \times 16 \times 1024 = 433$ ms.

From the above, the minimum time required to create the address table at the conventional flash memory-integrated system is $115 + 433 \approx 550$ ms.

On the other hand, in the present embodiment, it is calculate as follows.

With two banks, the number of blocks processed at one time is half the number of blocks (512), and the transferring time is $7\ \mu s \times 512 = 3.6$ ms.

Since one block of data is read at one time, the data reading time is $$0.05\ \mu s \times 512 = 0.0256\ ms$$

From the above, the minimum time required to create the address table at the flash memory-integrated system of the present embodiment is about 3.6 ms. This is the ratio of about 0.7% of the prior art, and thus significant time reduction can be realized. As shown in above, the time required for the detection processing of the defective block of the flash memory 12 by the flash memory-integrated system 10 of the present embodiment is sharply reduced as compared with the time required for the conventional detection processing of the defective block.

In the above, the embodiment of the present invention is described in detail with reference to the drawings, but the concrete construction is not limited to this embodiment, and the present invention includes the designs and the like within the scope of the spirit of the invention.

As explained thus far, in a nonvolatile semiconductor memory device, a nonvolatile semiconductor memory device-integrated system and a defective block detecting method according to the present invention, a block to be a target of detection of flag data is determined, logical product outputting circuit outputs logical product of data stored in memory cells of each memory cell string in the determined block, and detection of the flag data can be performed for each block based on the output of the logical product outputting circuit, for the nonvolatile semiconductor memory device storing the flag data indicating a defective block in part of memory cells of the defective block. As a result, the data of all the memory cells in one block is read by onetime processing according to the logical product of each of the memory cell strings, and detection of the flag data by one operation is performed based on the output of the logical product of each of all the memory cell strings, thus making it possible to detect whether all the memory cells in the selected block have the same data (all "1") at a high speed. Namely, it is possible to detect whether different data ("0"=flag data indicating a defective block) exists in the selected block or not at high speed.

With the aforementioned defective block detecting method, the number of memory cells which are the targets of data reading by one operation is significantly different as compared with the method of detecting the flag data by reading the data of each memory cell of the prior art, in other words, the defective block can be verified at a high speed.

What is claimed is:

1. A nonvolatile semiconductor memory device comprising:

a memory cell array with memory cell strings constituted of a plurality of memory cells connected in series being arranged in an array form, said nonvolatile semiconductor memory device setting a collective unit of arrangements of the memory cell strings in said memory cell array as a block, and storing flag data indicating a defective block in part of the memory cells of the defective block when the defective block including a defective memory cell exists in the block;

a block determining circuit for determining said block to be a target of detection of the flag data;

a logical product outputting circuit for outputting logical product of the data stored in said memory cells of each of said memory cell strings in the block designated by said block determining circuit; and a defective block detecting circuit for detecting the flag data for each of the blocks based on the output of said logical product outputting circuit.

2. The nonvolatile semiconductor memory device according to claim 1, wherein said logical product outputting circuit is a page buffer circuit for latching each data stored in a plurality of said memory cells connected to a same word line and outputting the latched data, said nonvolatile semiconductor memory device, further comprising: a control circuit for controlling said page buffer circuit and said memory cells so that said page buffer circuit latches the logical product of the data stored in said memory cells of each of said memory cell strings, in the block determined by said block determining circuit.

3. The nonvolatile semiconductor memory device according to claim 1, wherein said defective block detecting circuit detects the flag data for each of the blocks by obtaining logical sum of an output of said logical product outputting circuit.

4. The nonvolatile semiconductor memory device according to claim 1, further comprising: an output control circuit for outputting a detection result outputted by said defective block detecting circuit from an output terminal correspondingly to a change in an external control signal inputted from an outside.

5. The nonvolatile semiconductor memory device according to claim 1, wherein said block determining circuit determines the block based on an address previously given to each block, said nonvolatile semiconductor memory device further comprising:

an output control circuit for outputting a detection result outputted by said defective block detecting circuit from an output terminal correspondingly to a first change in an external control signal inputted from an outside; and an address adding circuit for incrementing an address for determining the block correspondingly to a second change in said external control signal.

6. The nonvolatile semiconductor memory device according to claim 1, wherein said nonvolatile semiconductor memory device is a NAND type flash memory.

7. A nonvolatile semiconductor memory device comprising:

a memory cell array with memory cell strings constituted of a plurality of memory cells connected in series being arranged in an array form, said nonvolatile semiconductor memory device setting a collective unit of arrangements of the memory cell strings in said memory cell array as a block, and storing flag data indicating a defective block in part of the memory cells of the defective block when the defective block including a defective memory cell exists in the block;

a first select gate circuit interposed between one end of said memory cell string and a bit line, and controlling connection between said memory cell string and the bit line;

a second select gate circuit interposed between the other end of said memory cell string and a source line, and controlling connection between said memory cell string and the source line;

a page buffer circuit connected to each of the bit lines, and latching the data stored in said memory cells;

a block determining circuit for determining said block to be a target of detection of the flag data;

a control circuit for controlling said first select gate circuit and said second select gate circuit so that all of said memory cell strings are connected to the bit lines and the source line, and controlling said page buffer circuit so as to latch data of logical product of the memory cells constituting said memory cell string from the bit line and output the latched data, in the block determined by said block determining circuit; and a defective block detecting circuit for outputting a detection result of the flag data based on logical sum of an output of said page buffer circuit.

8. The nonvolatile semiconductor memory device according to claim 7, wherein voltage from 0 V to voltage to be pre-charged into the bit line is applied to the source line.

9. The nonvolatile semiconductor memory device according to claim 7, further comprising an output control circuit for outputting the detection result outputted by said defective block detecting circuit from an output terminal correspondingly to a change in an external control signal inputted from an outside.

10. The nonvolatile semiconductor memory device according to claim 7,
wherein said block determining circuit determines said block based on an address previously given to each block,
said nonvolatile semiconductor memory device, further comprising:
an output control circuit for outputting the detection result outputted by said defective block detection circuit from an output terminal correspondingly to a first change in an external control signal inputted from an outside; and
an address adding circuit for incrementing the address for determining the block correspondingly to a second change in the external control signal.

11. The nonvolatile semiconductor memory device according to claim 7, wherein said nonvolatile semiconductor memory device is a NAND type flash memory.

12. A nonvolatile semiconductor memory device-integrated system including a nonvolatile semiconductor memory device comprising:
a memory cell array with memory cell strings constituted of a plurality of memory cells connected in series being arranged in an array form, said nonvolatile semiconductor memory device setting a collective unit of arrangements of the memory cell strings in said memory cell array as a block, and storing flag data indicating a defective block in part of the memory cells of the defective block when the defective block including a defective memory cell exists in the block;
a block determining circuit for determining the block to be a target of detection of the flag data based on inputted block determining information;
a logical product outputting circuit for outputting logical product of the data stored in said memory cells of each of said memory cell strings in the block determined by said block determining circuit; and
a defective block detecting circuit for detecting the flag data for each of the blocks based on the output of said logical product outputting circuit,
said nonvolatile semiconductor memory device-integrated system, comprising:
a block determining information generating circuit for generating the block determining information to be inputted into said nonvolatile semiconductor memory device;
a taking circuit for taking a detection result of said defective block detecting circuit from said nonvolatile semiconductor memory device, and
a defective block information storing circuit for storing the block determining information generated by said block determining information generating circuit as defective block determining information when the detection result taken out by said taking circuit has detection of the flag data.

13. The nonvolatile semiconductor memory device-integrated system according to claim 12,
wherein said nonvolatile semiconductor memory device performs processing of detecting the defective block by setting a defective block detection command for starting processing of detecting the defective block,
said nonvolatile semiconductor memory device-integrated system further comprising: defective block detection command setting circuit for setting the defective block detection command into said nonvolatile semiconductor memory device.

14. The nonvolatile semiconductor memory device-integrated system according to claim 13, wherein said defective block detection command setting circuit sets the defective block detection command into said nonvolatile semiconductor memory device only once.

15. The nonvolatile semiconductor memory device-integrated system according to claim 12,
wherein said nonvolatile semiconductor memory device further comprises an output control circuit for outputting the detection result outputted by said defective block detecting circuit from an output terminal correspondingly to a change in an external control signal inputted from an outside, and
wherein said taking circuit takes the detection result by supplying the external control signal to said nonvolatile semiconductor memory device.

16. The nonvolatile semiconductor memory device-integrated system according to claim 12,
wherein in said nonvolatile semiconductor device,
said logical product outputting circuit is a page buffer circuit for latching each data stored in a plurality of said memory cells connected to a same word line and outputting it, and
said nonvolatile semiconductor device further comprises control circuit for controlling said page buffer circuit and said memory cells so that said page buffer circuit latches logical product of the data stored in said memory cells for each of said memory cell string, in the block determined by said block determining circuit,
said nonvolatile semiconductor memory device further comprising control signal generating circuit for supplying a control signal for controlling said control circuit of said nonvolatile semiconductor memory device.

17. The nonvolatile semiconductor memory device-integrated system according to claim 12, wherein said defective block detecting circuit of said nonvolatile semiconductor memory device performs detection of the flag data for each of the blocks by obtaining logical sum of output of said logical product outputting circuit.

18. The nonvolatile semiconductor memory device-integrated system according to claim 12,
wherein in said nonvolatile semiconductor memory device,
said block determining circuit determines the block based on an address previously given to each block,
said nonvolatile semiconductor memory device further comprises:
an output control circuit for outputting the detection result outputted by said defective block detecting circuit from an output terminal correspondingly to a first change in an external control signal inputted from an outside; and
address adding circuit for incrementing an address for determining the block correspondingly to a second change in the external control signal.

19. The nonvolatile semiconductor memory device-integrated system according to claim 12, wherein said nonvolatile semiconductor device is a NAND type flash memory.

20. A defective block detecting method for detecting a defective block by means of a nonvolatile semiconductor memory device comprising:

a memory cell array with memory cell strings constituted of a plurality of memory cells connected in series being arranged in an array form, said nonvolatile semiconductor memory device setting a collective unit of arrangements of the memory cell strings in said memory cell array as a block, and storing flag data indicating a defective block in part of the memory cells of the defective block when the defective block including a defective memory cell exists in the block, said method comprising:

a first step of determining the block to be a target of detection of the flag data;

a second step of outputting logical product of data stored in said memory cells of each of said memory cell strings, in the block determined in said first step; and a third step of performing detection of the flag data for each of the block based on output of said second step.

21. The defective block detecting method according to claim 20, wherein a detection result outputted in said third step is outputted from an output terminal correspondingly to a change in an external control signal inputted from an outside.

22. The defective block detecting method according to claim 20, wherein said first step includes determining the block based on an address previously given to each block, and wherein a detection result outputted in said third step is outputted from an output terminal correspondingly to a first change in an external control signal inputted from an outside, said method further comprising a fourth step of incrementing the address for determining the block correspondingly to a second change in the external control signal.

23. A defective block detecting method for detecting a defective block by means of a nonvolatile semiconductor memory device in a nonvolatile semiconductor memory device-integrated system comprising the nonvolatile semiconductor memory device comprising:

a memory cell array with memory cell strings constituted of a plurality of memory cells connected in series being arranged in an array form, said nonvolatile semiconductor memory device setting a collective unit of arrangements of the memory cell strings in said memory cell array as a block, and storing flag data indicating a defective block in part of the memory cells of the defective block when the defective block including a defective memory cell exists in the block, said method comprising:

a first step of generating block determining information being information for determining the block to be a target of detection of the flag data, and inputting the information into said nonvolatile semiconductor memory device;

a second step of generating a control signal for outputting logical product of data stored in said memory cells of each of said memory cell strings as detection data in the block determined based on the block determining information in said nonvolatile semiconductor memory device, and inputting it into said nonvolatile semiconductor memory device;

a third step of generating a control signal for performing detection of the flag data for each of the block based on the detected data in said nonvolatile semiconductor memory device, and inputting it into said nonvolatile semiconductor memory device; and a fourth step of storing the block determining information generated in said first step into defective block information storing circuit as defective block determining information, when the flag data is detected in said third step in said nonvolatile semiconductor memory device.

* * * * *